United States Patent
Kikuchi

(10) Patent No.: US 12,324,064 B2
(45) Date of Patent: Jun. 3, 2025

(54) DISPLAY UNIT, METHOD OF MANUFACTURING THE SAME, AND ELECTRONIC APPARATUS

(71) Applicant: Sony Corporation, Tokyo (JP)

(72) Inventor: Koji Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 18/609,544

(22) Filed: Mar. 19, 2024

(65) Prior Publication Data

US 2024/0224388 A1 Jul. 4, 2024

Related U.S. Application Data

(63) Continuation of application No. 17/666,769, filed on Feb. 8, 2022, now Pat. No. 11,968,754, which is a (Continued)

(30) Foreign Application Priority Data

Mar. 21, 2013 (JP) .................... 2013-058492

(51) Int. Cl.
*H05B 33/22* (2006.01)
*H05B 33/10* (2006.01)
(Continued)

(52) U.S. Cl.
CPC .............. *H05B 33/22* (2013.01); *H05B 33/10* (2013.01); *H10K 50/856* (2023.02);
(Continued)

(58) Field of Classification Search
CPC ........ H05B 33/22; H05B 33/10; H10K 59/22; H10K 59/12; H10K 59/352; H10K 50/856
See application file for complete search history.

(56) References Cited

U.S. PATENT DOCUMENTS

2004/0113550 A1   6/2004   Adachi
2007/0145892 A1*  6/2007   Chen .................... H10K 50/856
                                                    313/506
(Continued)

FOREIGN PATENT DOCUMENTS

CN   102067727   5/2011
CN   102577616   7/2012
(Continued)

OTHER PUBLICATIONS

Office Action for JP Patent Application No. 2015-506692, issued on Jan. 9, 2018, 16 pages of Office Action and 08 pages of English Translation.

(Continued)

*Primary Examiner* — Evan P Dzierzynski
*Assistant Examiner* — Jessica M Apenteng
(74) *Attorney, Agent, or Firm* — K&L Gates LLP

(57) ABSTRACT

A display unit of the present disclosure includes: a plurality of pixels configured to emit emission light different from one another; and an insulating film provided between the plurality of pixels and having a reflective surface with respect to the emission light, in which an angle of the reflective surface of the insulating film is set for each of the pixels.

20 Claims, 20 Drawing Sheets

Related U.S. Application Data continuation of application No. 16/450,434, filed on Jun. 24, 2019, now Pat. No. 11,284,483, which is a continuation of application No. 14/771,557, filed as application No. PCT/JP2014/055675 on Mar. 5, 2014, now Pat. No. 10,334,692.

(51) Int. Cl.
*H10K 50/856* (2023.01)
*H10K 59/12* (2023.01)
*H10K 59/35* (2023.01)

(52) U.S. Cl.
CPC ........... *H10K 59/352* (2023.02); *H10K 59/12* (2023.02); *H10K 59/1201* (2023.02)

(56) References Cited

U.S. PATENT DOCUMENTS

| | | | |
|---|---|---|---|
| 2008/0165315 A1* | 7/2008 | Nishida | H10K 50/86 349/137 |
| 2010/0096988 A1 | 4/2010 | Kitabayashi et al. | |
| 2011/0198990 A1* | 8/2011 | Yoshida | H10K 59/35 313/504 |
| 2012/0080694 A1* | 4/2012 | Yoshida | H10K 50/85 257/89 |
| 2012/0193658 A1 | 8/2012 | Matsushima | |
| 2013/0105782 A1 | 5/2013 | Matsushima | |

FOREIGN PATENT DOCUMENTS

| | | |
|---|---|---|
| JP | 2004-192977 | 7/2004 |
| JP | 2004-205974 | 7/2004 |
| JP | 2005-166691 | 6/2005 |
| JP | 2006-030250 | 2/2006 |
| JP | 2010-153127 | 7/2010 |
| KR | 20050097120 | 10/2005 |
| KR | 2015-0113302 | 10/2012 |
| WO | 2010/023839 | 3/2010 |
| WO | WO2010143360 | 12/2010 |
| WO | 2012/049719 | 4/2012 |

OTHER PUBLICATIONS

Office Action for CN Patent Application No. 201480014944.2, issued on Aug. 17, 2016, 6 pages of Office Action and 9 pages of English translation.

Korean Office Action issued Apr. 28, 2019 in corresponding Korean Application No. 10-2015-7054456.

Korean Office Action issued May 11, 2020 in corresponding Korean Patent Application No. 10-2019-7037597 and English translation of same. 29 pages.

\* cited by examiner

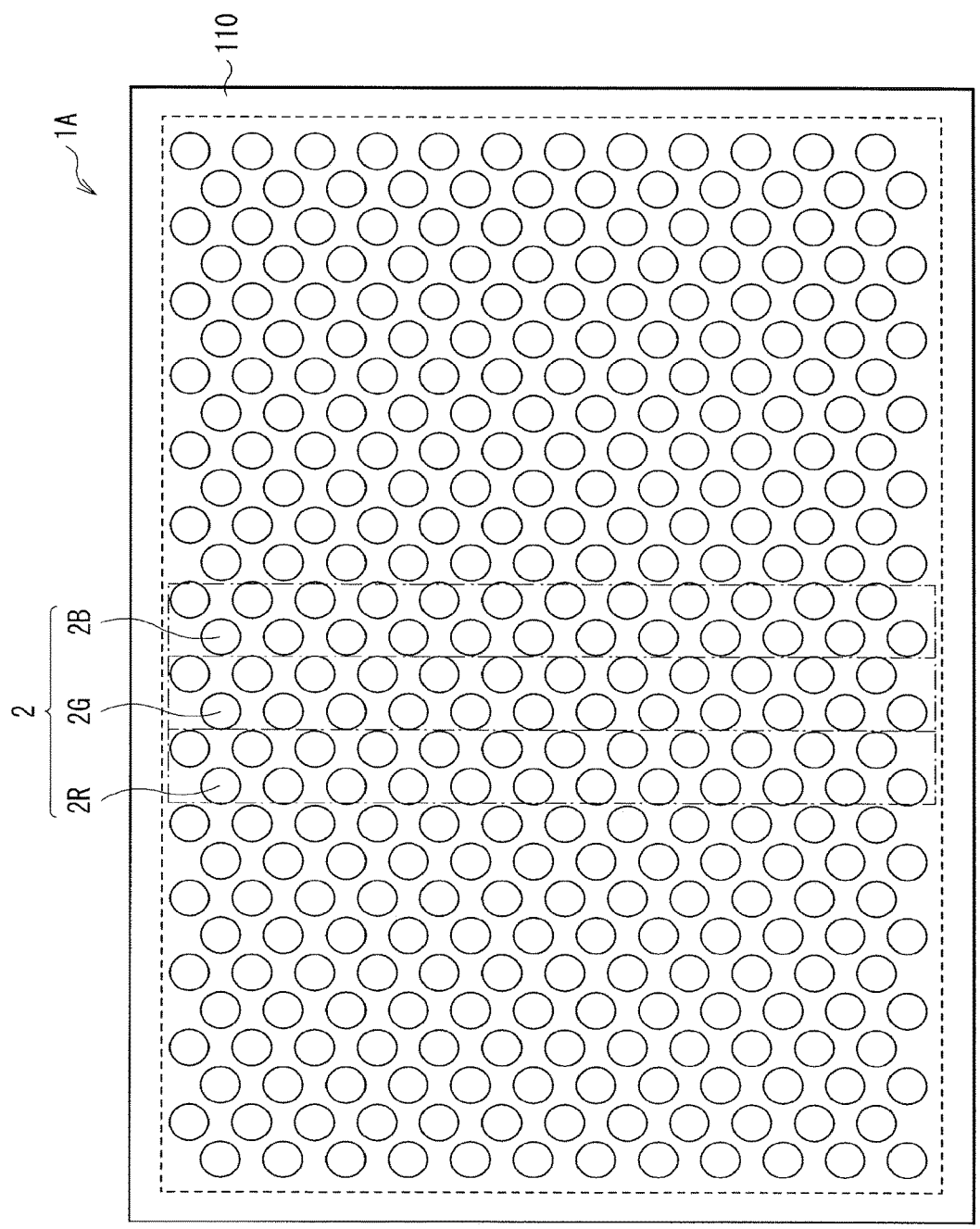

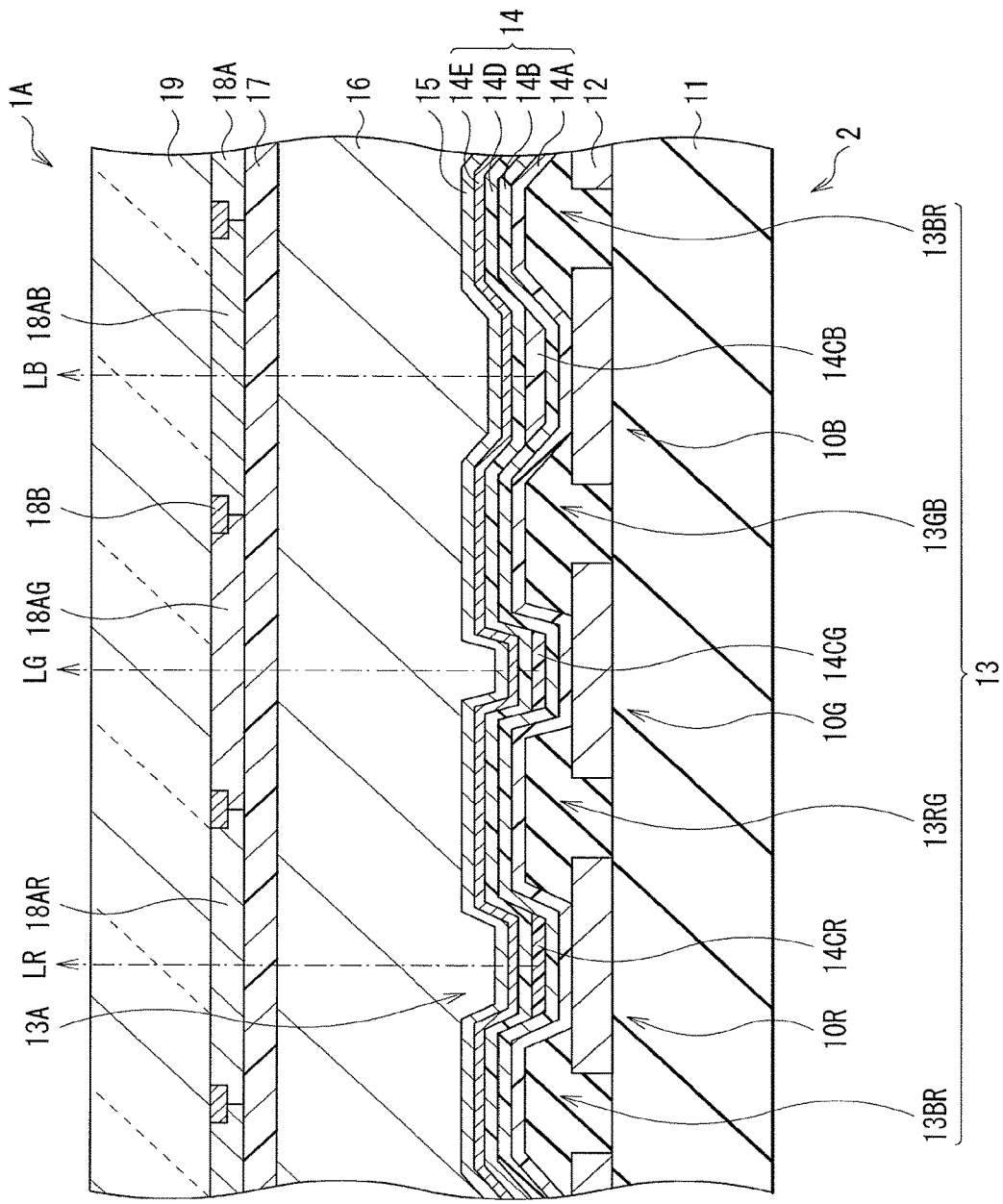
[FIG. 2]

[ FIG. 3A ]
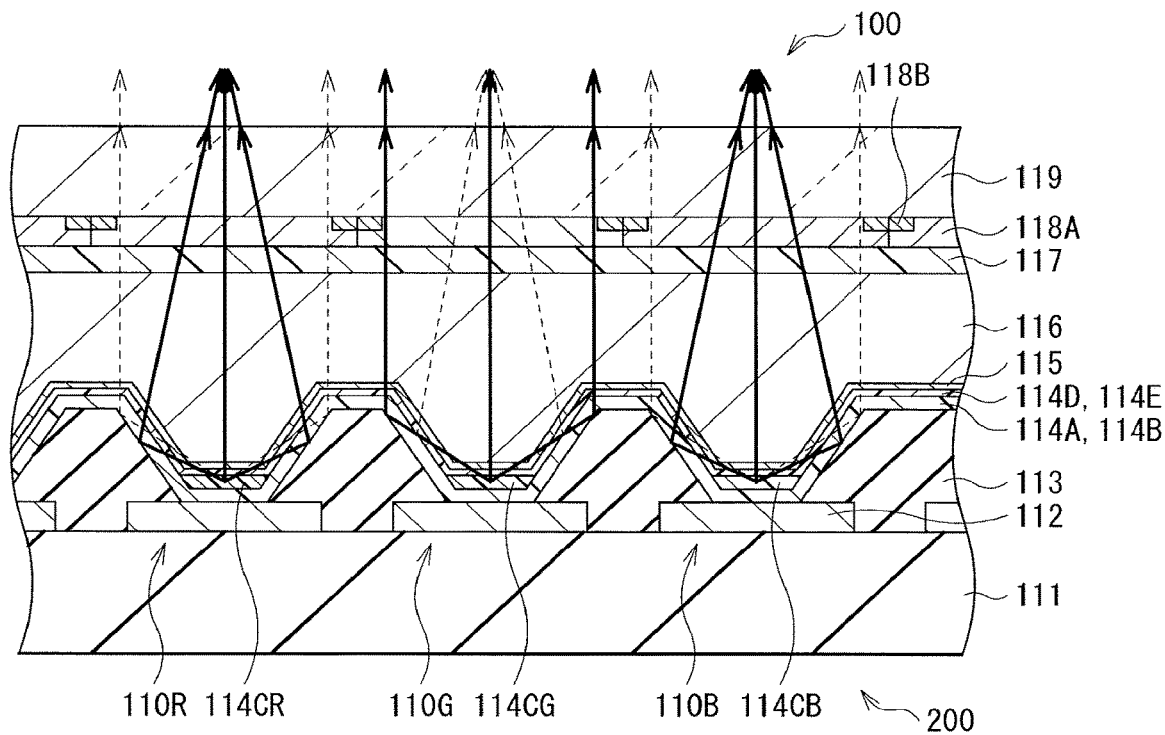
[ FIG. 3B ]
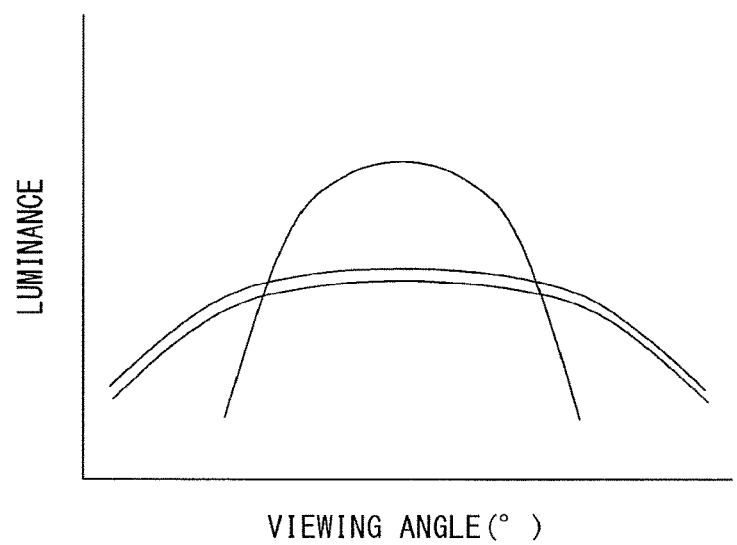

[ FIG. 4A ]
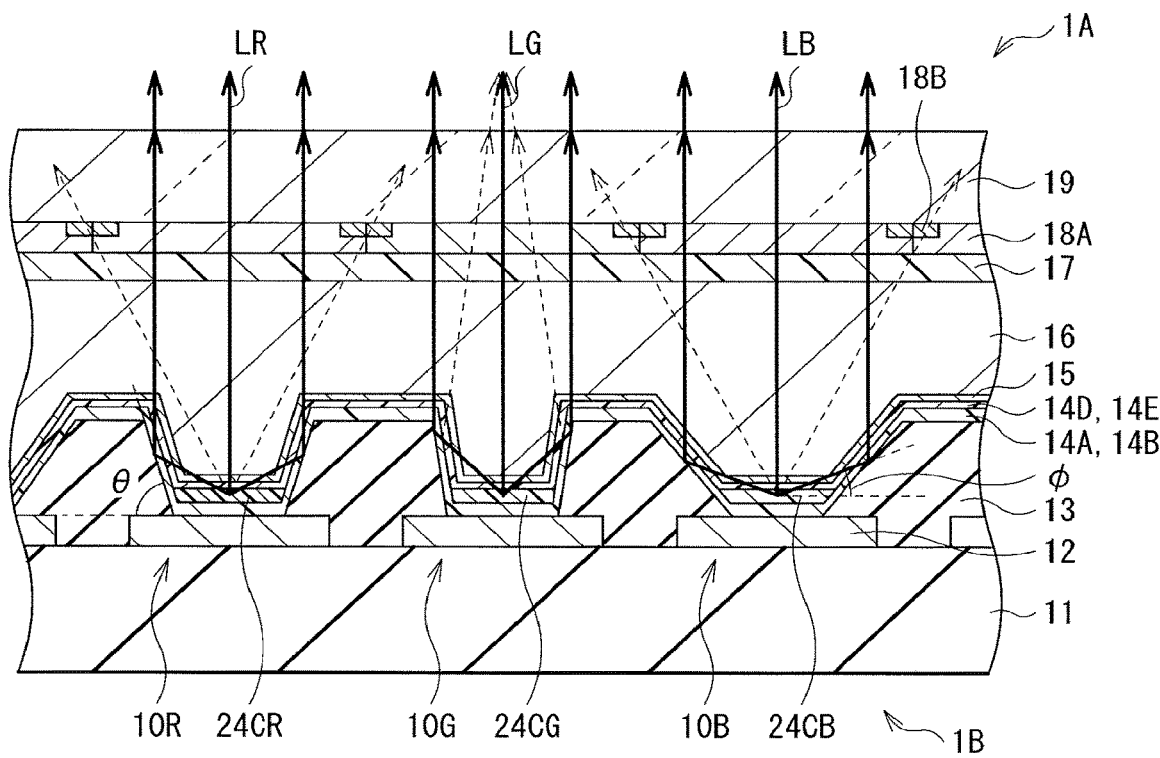
[ FIG. 4B ]
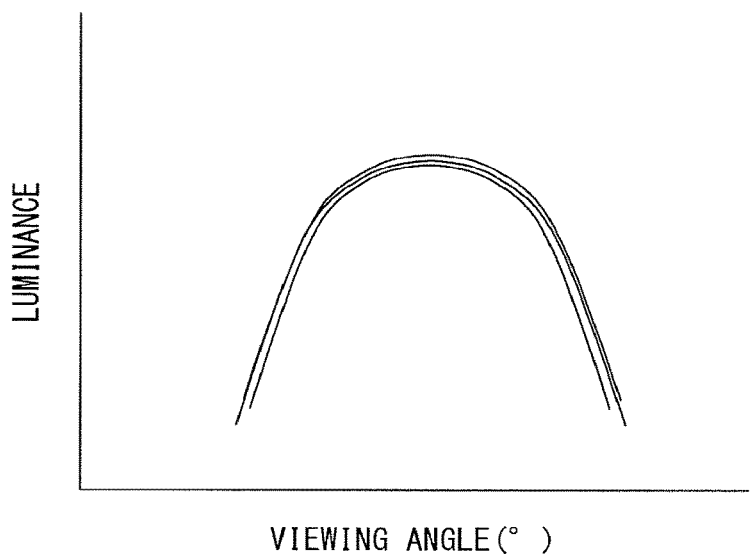

[FIG. 5]
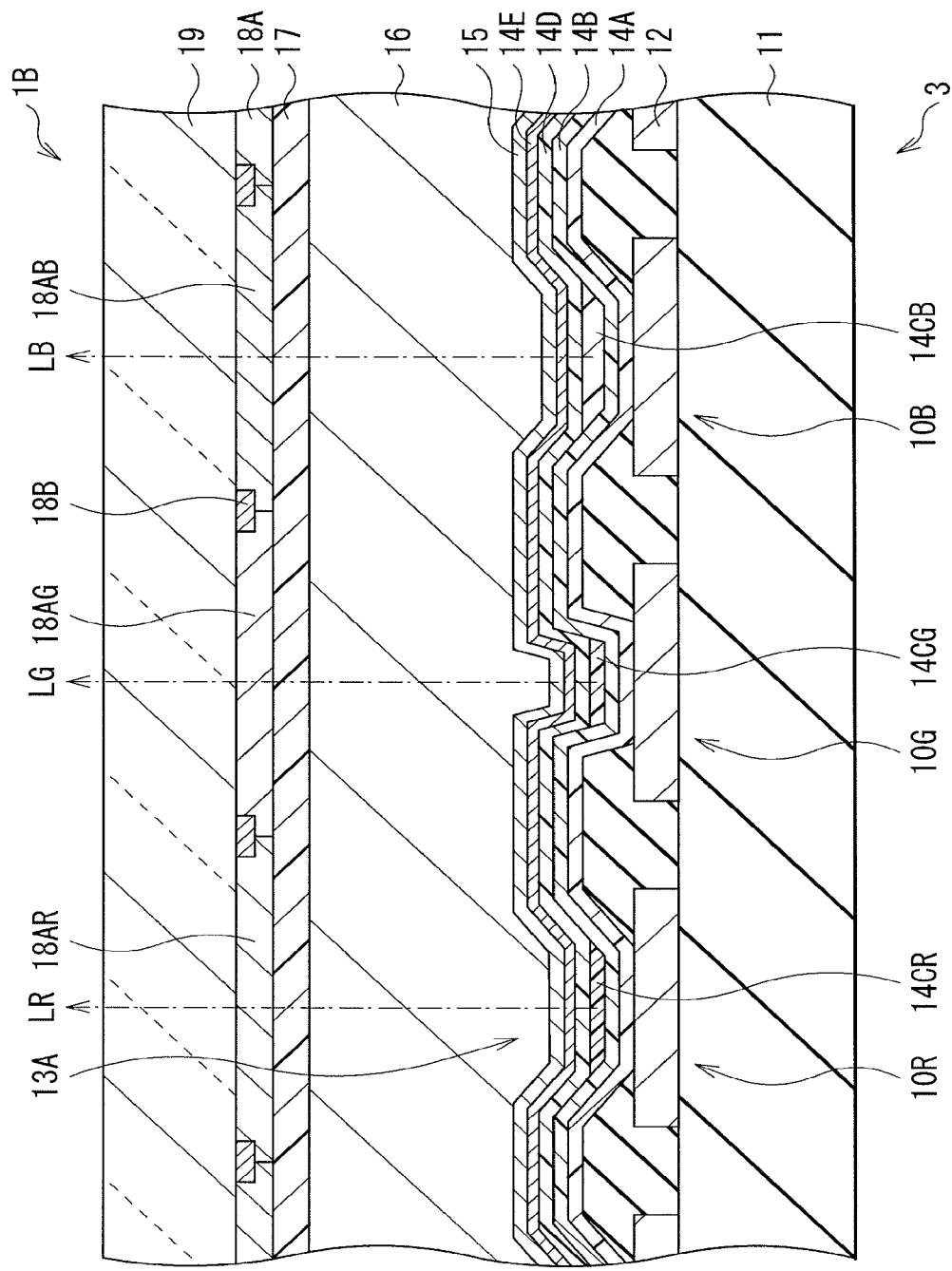

[ FIG. 6 ]
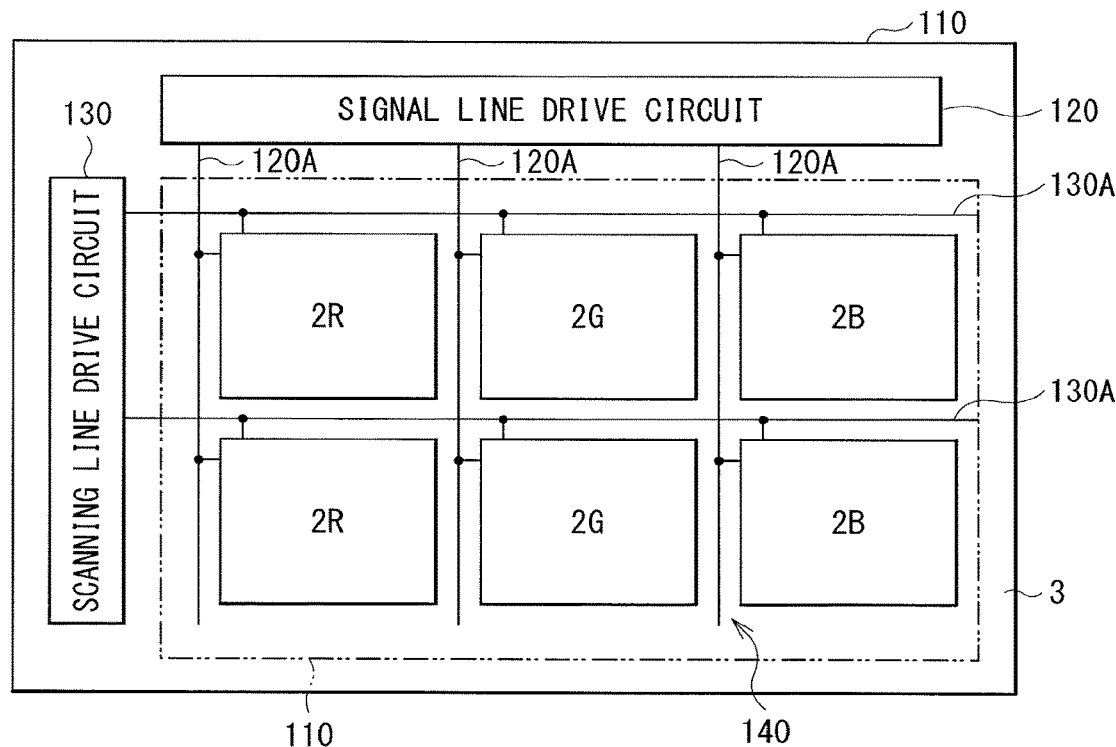
[ FIG. 7 ]
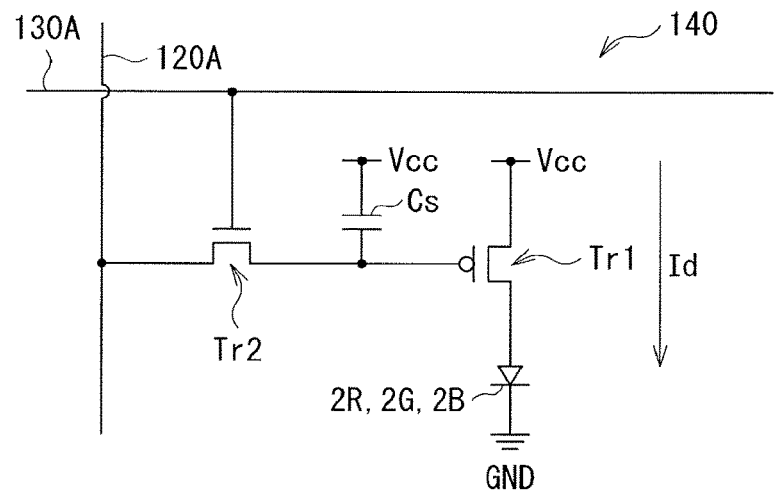

[ FIG. 8A ]
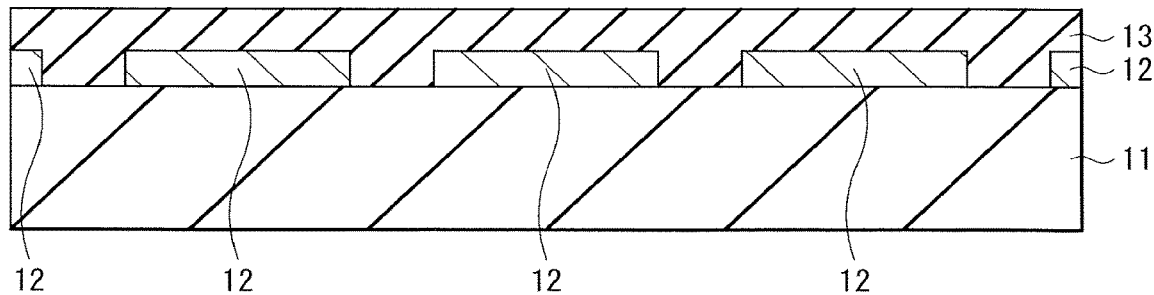
[ FIG. 8B ]
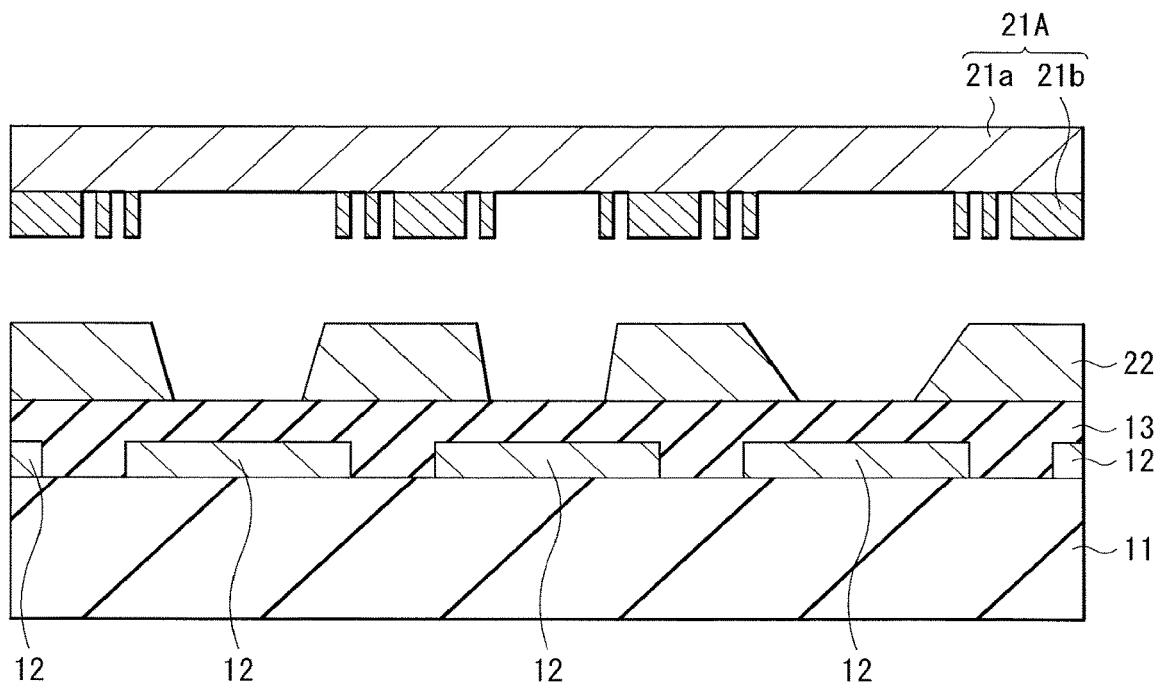
[ FIG. 8C ]
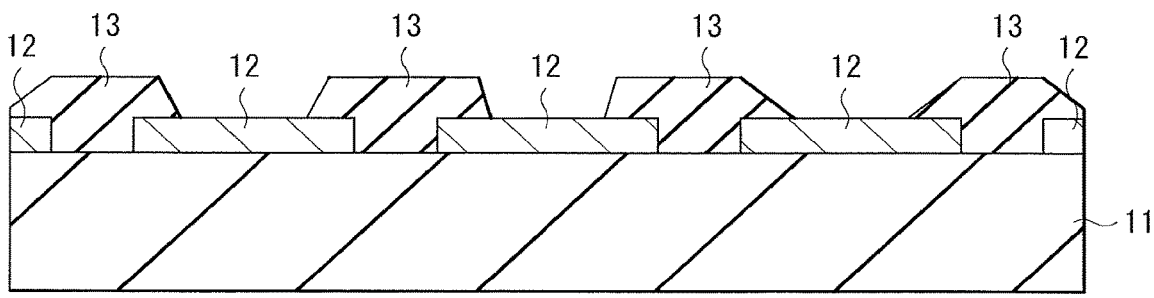

[ FIG. 9 ]
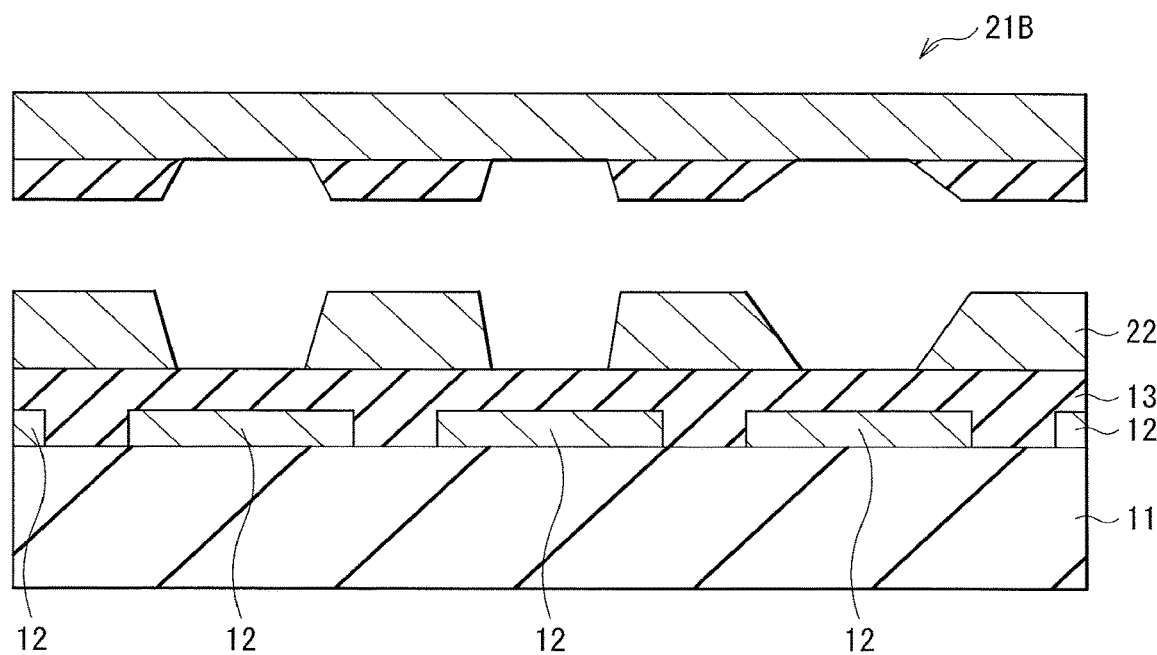

[ FIG. 10A ]
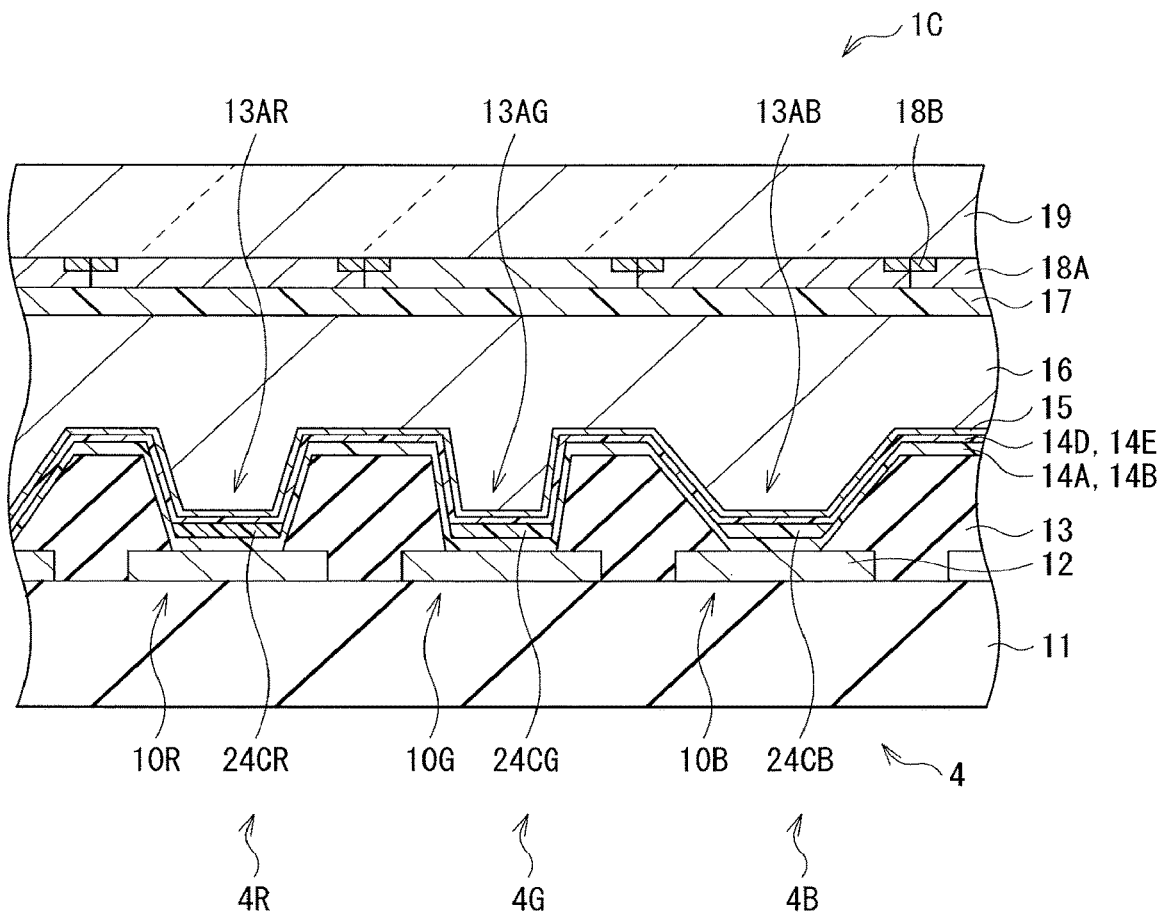
[ FIG. 10B ]
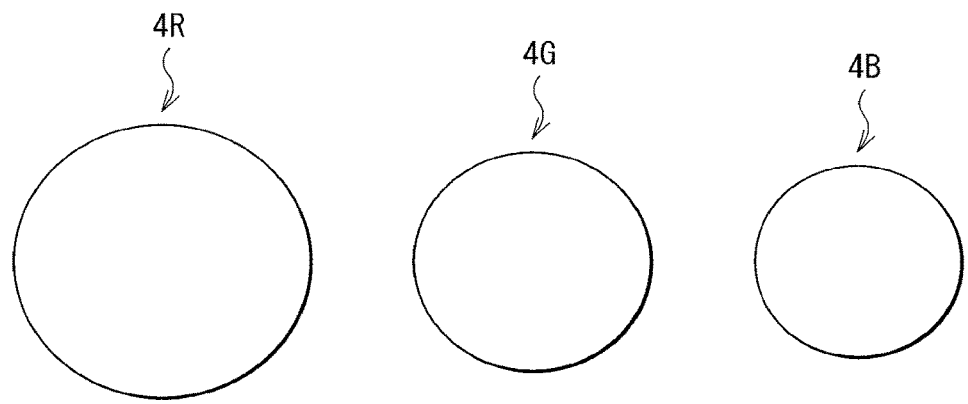

[ FIG. 11 ]
(A) 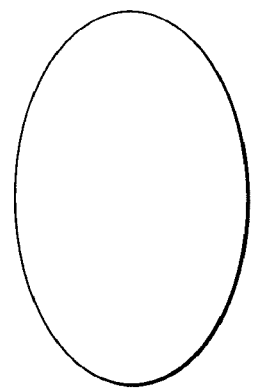
(B) 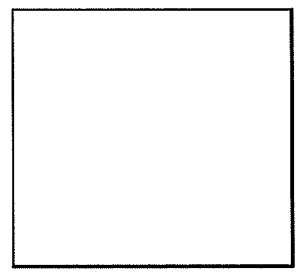
(C) 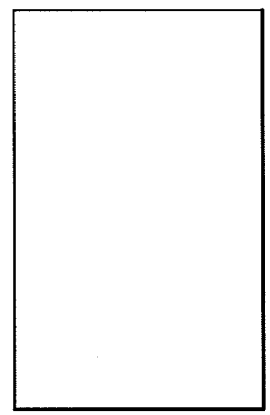
(D) 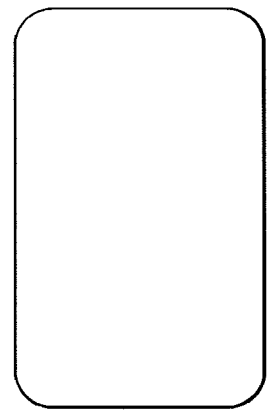

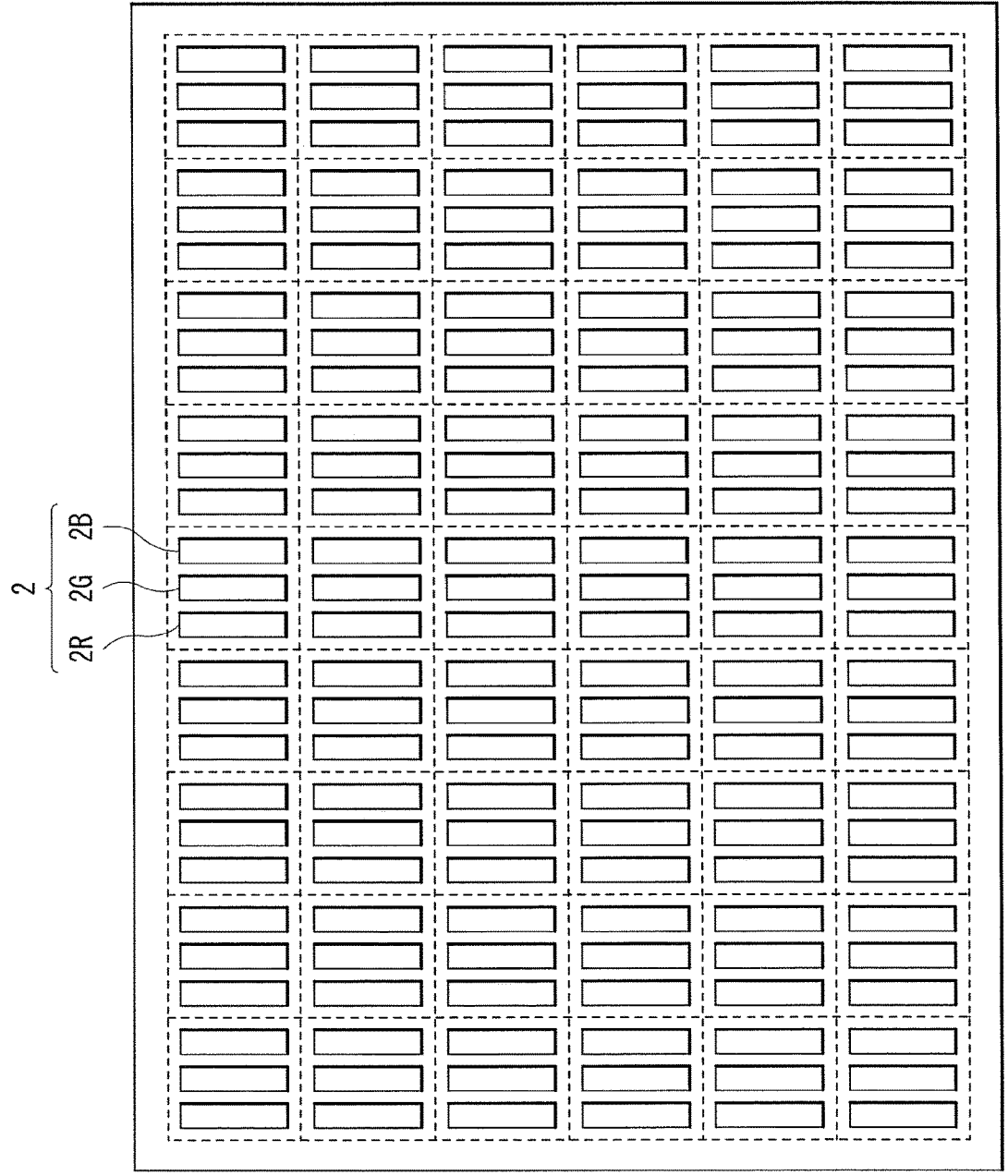
[FIG. 12]

[ FIG. 13A ]
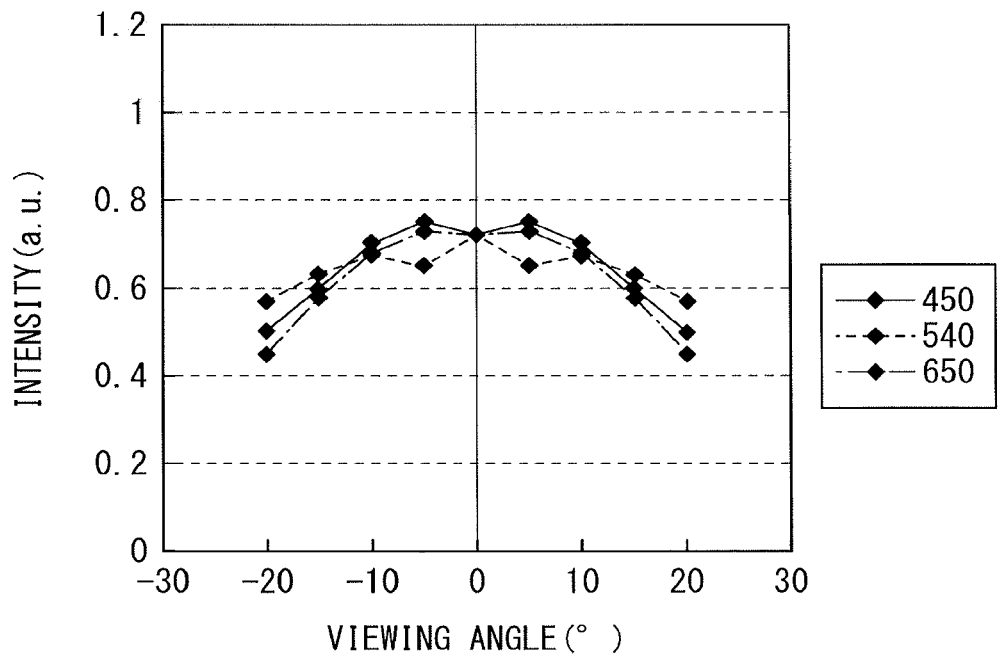
[ FIG. 13B ]
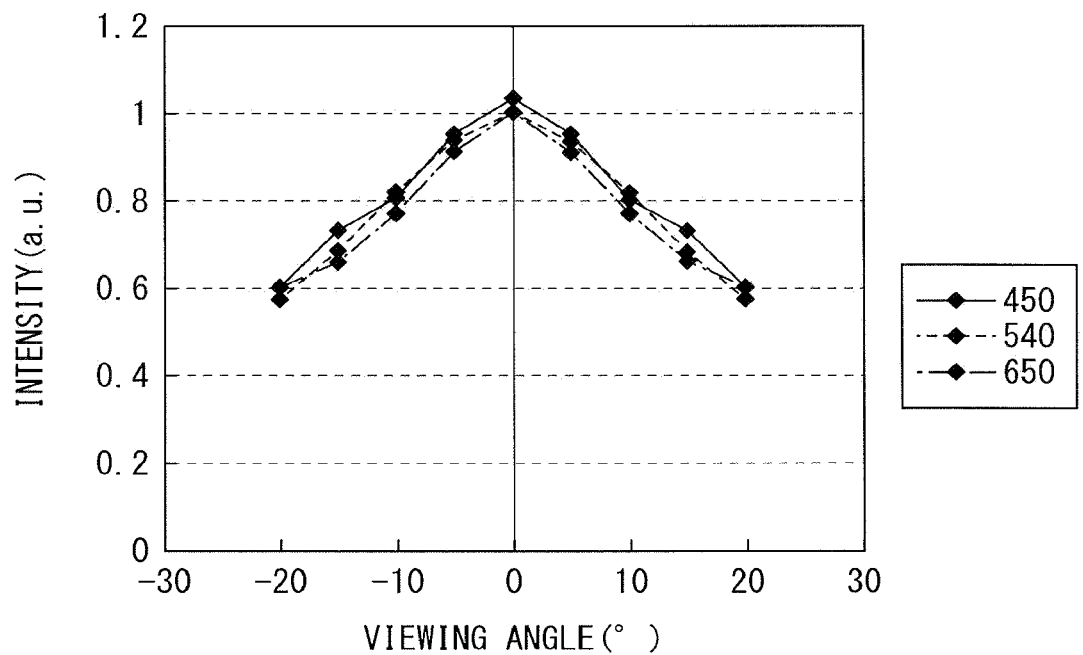

[ FIG. 14A ]
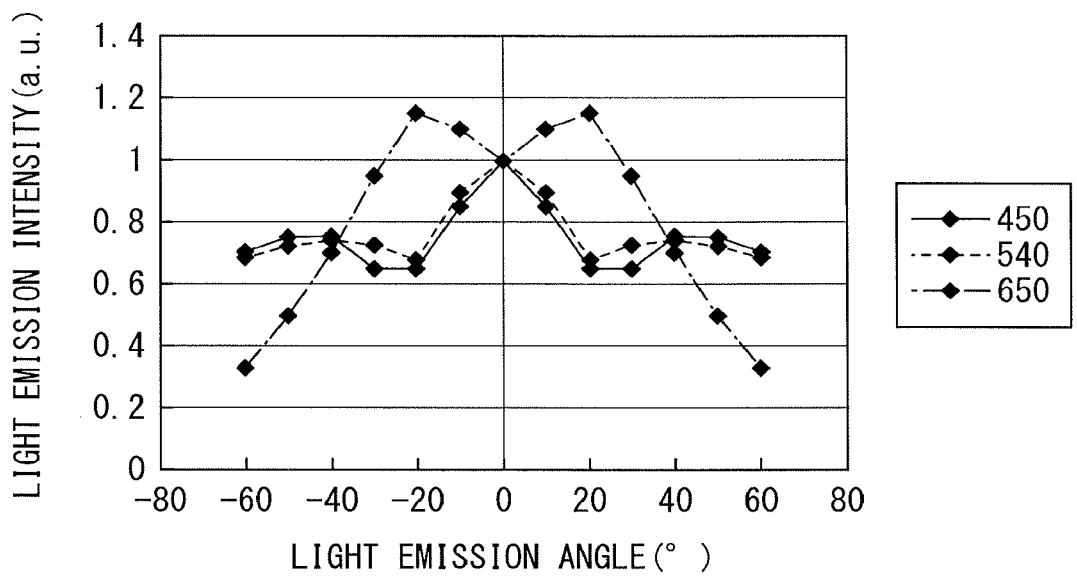
[ FIG. 14B ]
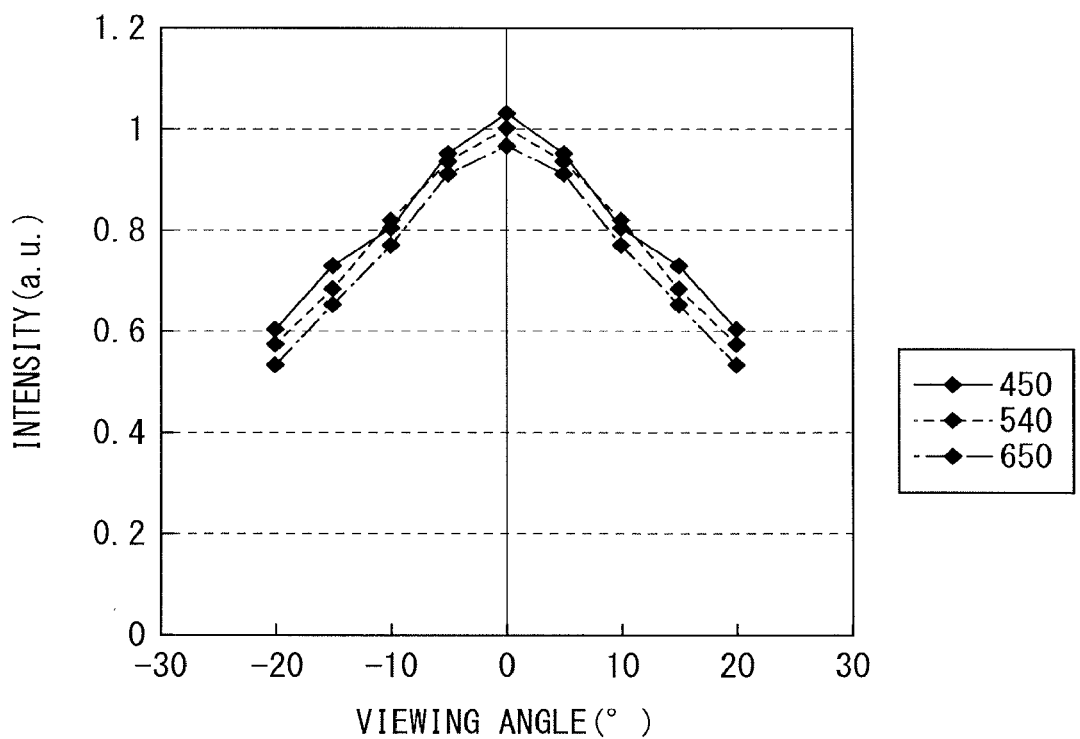

[ FIG. 15A ]
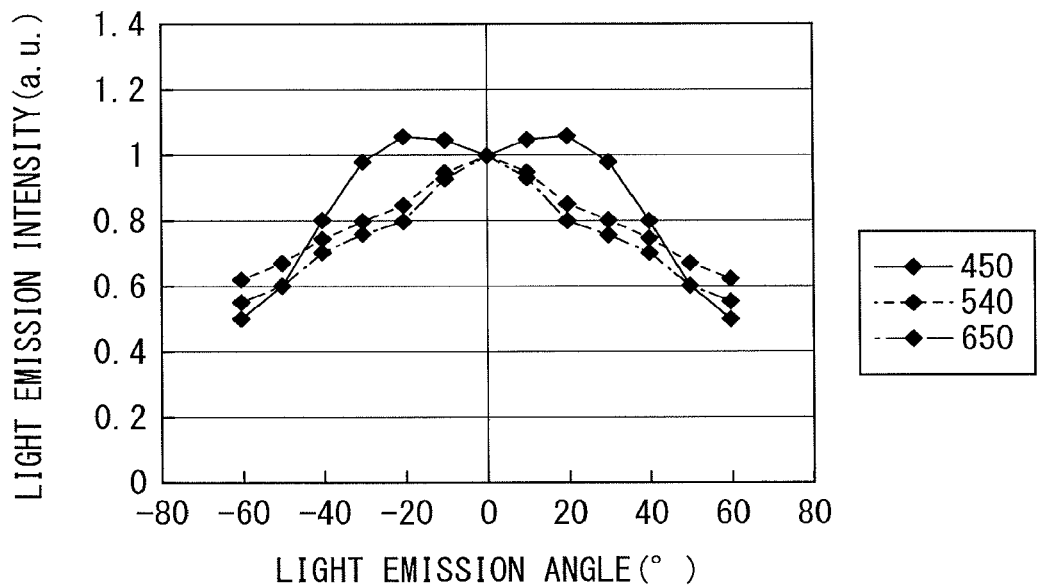
[ FIG. 15B ]
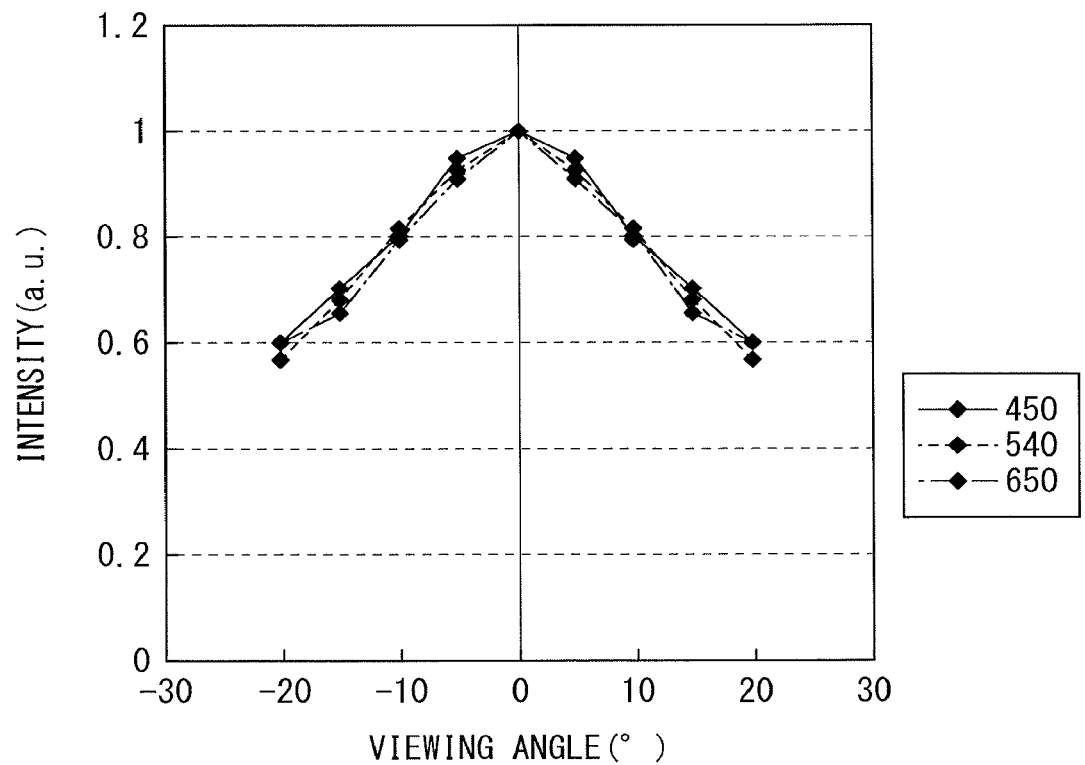

[ FIG. 16 ]
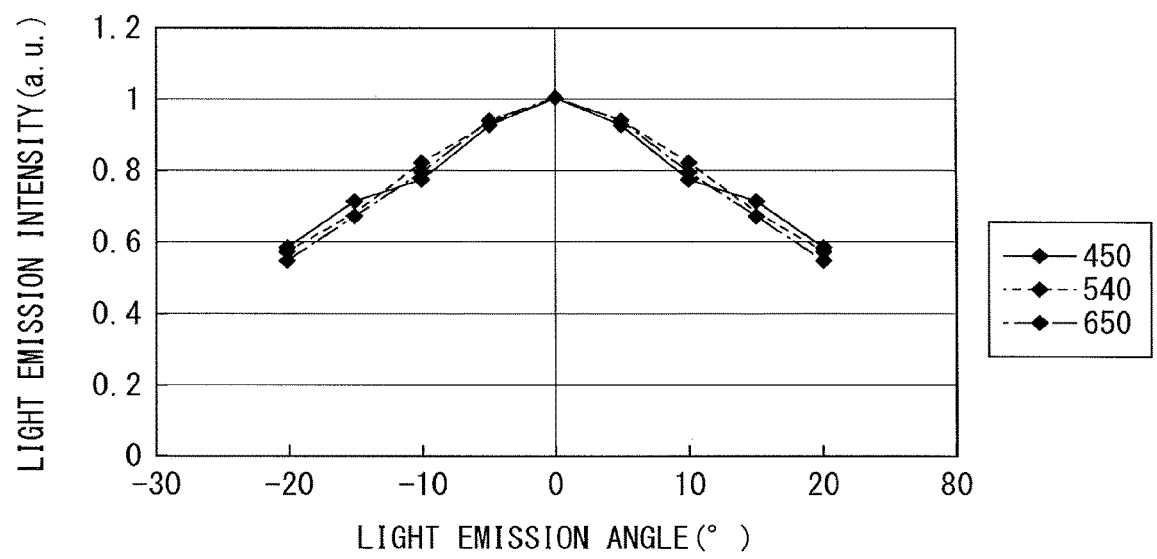

[ FIG. 17A ]
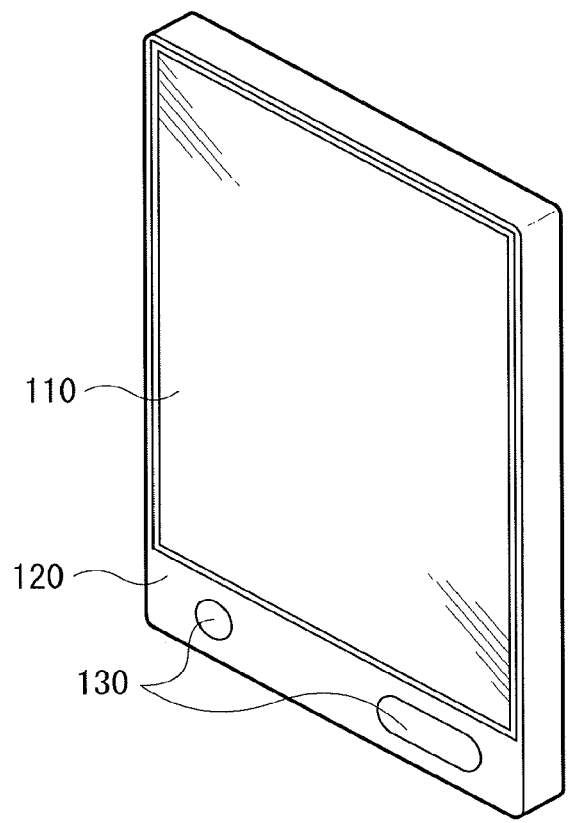
[ FIG. 17B ]
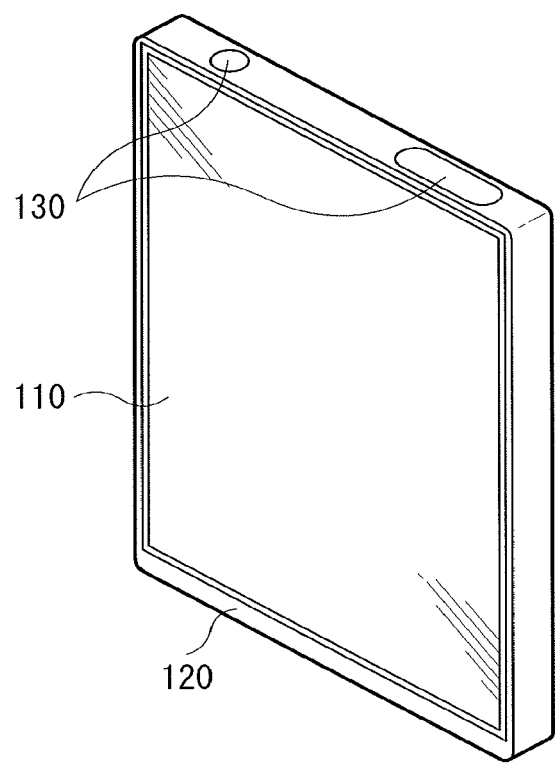

[ FIG. 18 ]
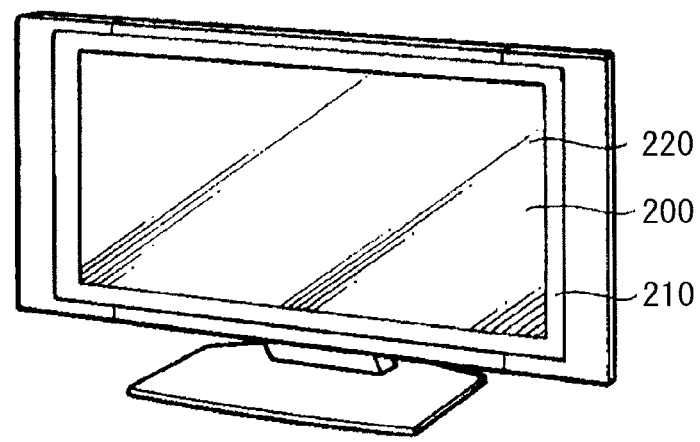
[ FIG. 19A ]
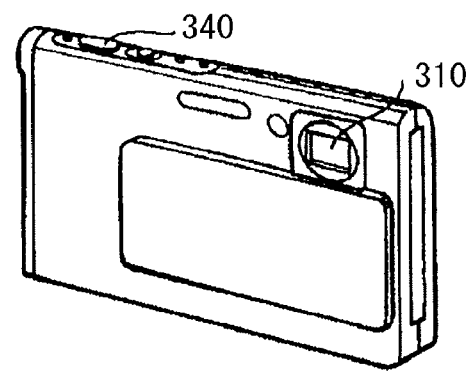
[ FIG. 19B ]
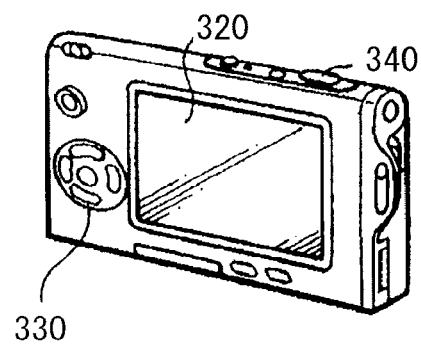

[ FIG. 20 ]
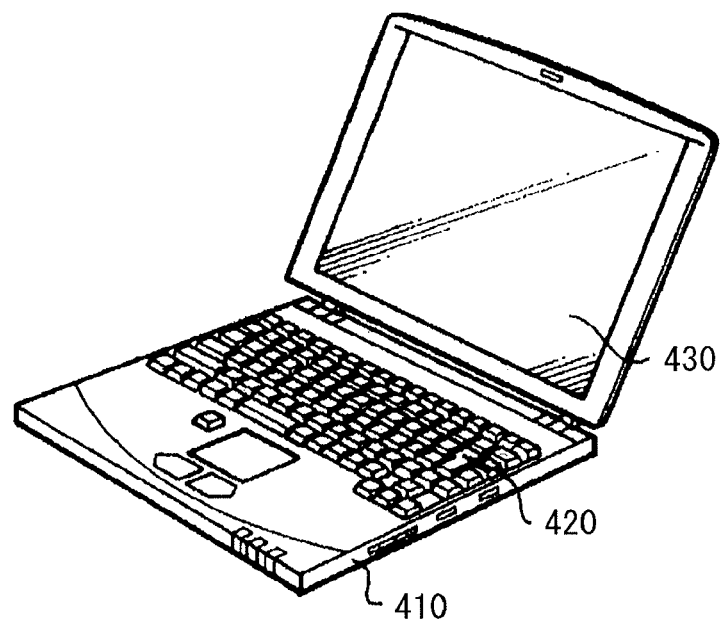
[ FIG. 21 ]
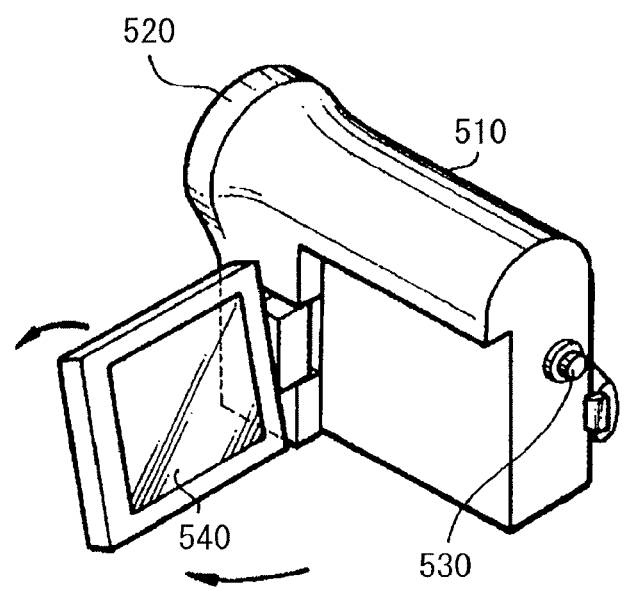

[ FIG. 22A ]
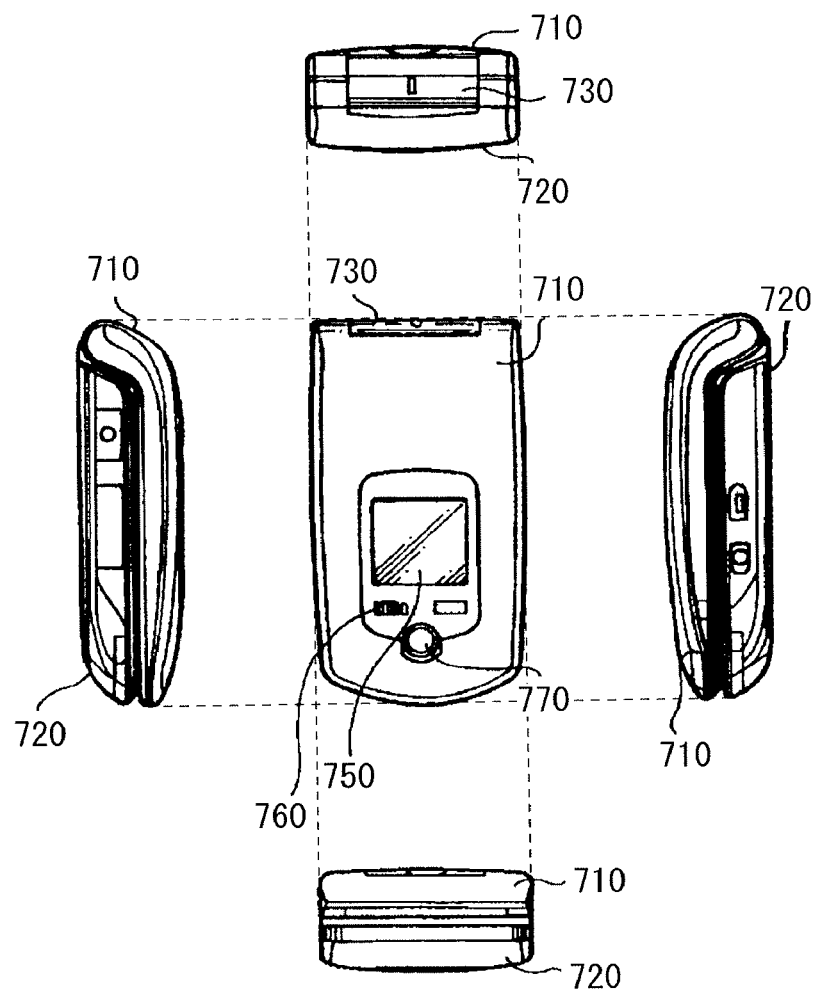

[ FIG. 22B ]
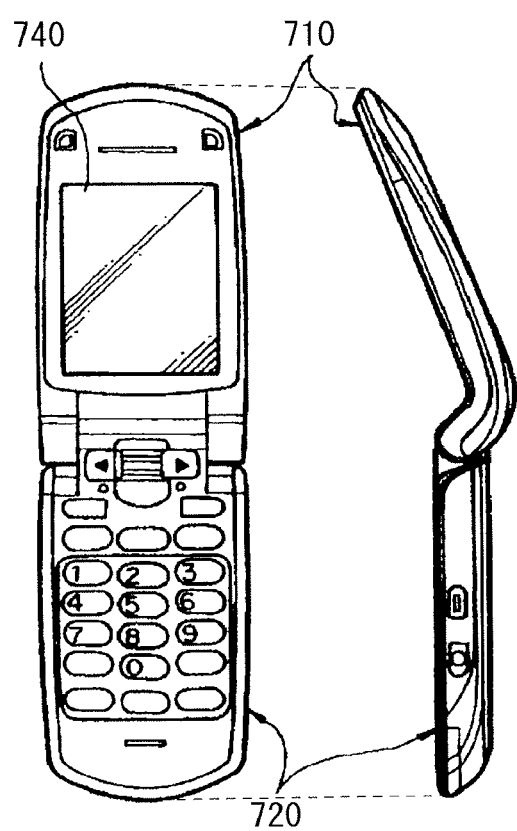

DISPLAY UNIT, METHOD OF MANUFACTURING THE SAME, AND ELECTRONIC APPARATUS

CROSS REFERENCES TO RELATED APPLICATIONS

The present application is a continuation of U.S. patent application Ser. No. 17/666,769, filed on Feb. 8, 2022, which is a continuation of U.S. patent application Ser. No. 16/450, 434, filed on Jun. 24, 2019, now U.S. Pat. No. 11,284,483, issued on Mar. 22, 2022, which is a continuation of U.S. patent application Ser. No. 14/771,557, filed on Aug. 31, 2015, now U.S. Pat. No. 10,334,692, issued on Jun. 25, 2019, which application is a National Stage Entry of PCT Application No. PCT/JP2014/055675, filed on Mar. 5, 2014, which application claims priority from Japanese Patent Application No. 2013-058492, filed on Mar. 21, 2013, the contents of each are hereby incorporated by reference into this application.

TECHNICAL FIELD

The present disclosure relates to a display unit that emits light with use of an organic electroluminescence (EL) phenomenon, a method of manufacturing the same, and an electronic apparatus including the same.

BACKGROUND

As development of information and communications industry has been accelerated, display devices having high performance have been demanded. In particular, an organic EL device that has attracted attention as a next-generation display device has advantages, as a self-luminous display device, of not only a wide viewing angle and excellent contrast but also fast response speed.

The organic EL device (light-emitting device) has a configuration in which a plurality of layers including a light-emitting layer are laminated. More specifically, the organic EL device may be configured of, for example, a wiring layer connected to a TFT that controls driving of the light-emitting device, an anode that injects holes, the light-emitting layer, a cathode that injects electrons, a resin, a color filter layer, and a pixel separation layer. The light-emitting device emits light by injecting holes and electrons from the anode and the cathode, respectively, to the light-emitting layer and recombining the holes and the electrons. One of the anode and the cathode sandwiching the light-emitting layer therebetween also acts as a reflective mirror to produce an interference effect different according to a light emission angle or a wavelength. Therefore, light emission intensity of the light-emitting device greatly differs by the light emission angle and the wavelength.

For example, in a case where the light emission angle is large, emission light propagates in a device, and is not allowed to exit from a panel. Therefore, for example, in Patent Literature 1, there is disclosed a display unit in which component light leaked to an insulating film is returned an organic layer with use of a laminate of optical films of two kinds having different refractive indices from each other as insulating films that separate a plurality of light-emitting devices from one another. Moreover, in Patent Literature 2, there is disclosed a display unit in which an optical distance of a light-emitting device including a resonance section is set for each device.

CITATION LIST

Patent Literature

Patent Literature 1: Japanese Unexamined Patent Application Publication No. 2010-153127
Patent Literature 1: Japanese Unexamined Patent Application Publication No. 2006-30250

SUMMARY

However, in the display unit in Patent Literature 1, there is an issue that even though light emission efficiency is improved, color reproductivity varies according to the viewing angle. Moreover, in the display unit in Patent Literature 2, there is an issue that even though color reproductivity is improved, a manufacturing process is complicated.

Therefore, it is desirable to provide a display unit that is able to improve color productivity by a simple method and to suppress variation in luminance, a method of manufacturing the same, and an electronic apparatus.

A display unit according to an embodiment of the present technology includes: a plurality of pixels configured to emit emission light different from one another; and an insulating film provided between the plurality of pixels and having a reflective surface with respect to the emission light, in which an angle of the reflective surface of the insulating film is set for each of the pixels.

A method of manufacturing a display unit according to an embodiment of the present technology includes: arranging a plurality of pixels configured to emit emission light different from one another; and forming, between the plurality of pixels, an insulating film having a reflective surface with respect to the emission light and in which an angle of the reflective surface is set for each of the pixels.

An electronic apparatus according to an embodiment of the present technology includes the above-described display unit.

In the display unit, the method of manufacturing the same, and the electronic apparatus according to the embodiments of the present technology, the insulating film having a reflective surface is provided between the pixels, and the insulating film is so formed as to set the angle of the reflective surface of the insulating film for each pixel; therefore, emission light with high light emission intensity in each pixel is allowed to be reflected to an arbitrary direction.

According to the display unit, the method of manufacturing the same, and the electronic apparatus of the embodiments of the present technology, the insulating film is so formed as to set the reflective surface angle thereof for each pixel; therefore, the emission direction of emission light with high light emission intensity in each pixel is adjusted. Accordingly, color reproductivity of each pixel is allowed to be improved. Moreover, variation in light emission luminance in each pixel is allowed to be suppressed.

BRIEF DESCRIPTION OF DRAWINGS

FIG. 1 is a plan view illustrating a configuration of a display unit according to an embodiment of the present disclosure.

FIG. 2 is a sectional view illustrating an example of one pixel of the display unit illustrated in FIG. 1.

FIG. 3A is a schematic view illustrating an optical path of emission light in a display unit according to a comparative example.

FIG. 3B is a characteristic diagram illustrating a relationship between a viewing angle and luminance of the display unit illustrated in FIG. 3A.

FIG. 4A is a schematic view illustrating an optical path of emission light in the display unit illustrated in FIG. 1.

FIG. 4B is a characteristics diagram illustrating a relationship between a viewing angle and luminance of the display unit illustrated in FIG. 1.

FIG. 5 is a sectional view illustrating another example of one pixel of the display unit illustrated in FIG. 1.

FIG. 6 is a diagram illustrating a configuration of the display unit illustrated in FIG. 1.

FIG. 7 is a diagram illustrating an example of a pixel drive circuit of the display unit illustrated in FIG. 6.

FIG. 8A is a sectional view for describing an example of a method of manufacturing the display unit illustrated in FIG. 1.

FIG. 8B is a sectional view illustrating a process following FIG. 8A.

FIG. 8C is a sectional view illustrating a process following FIG. 8B.

FIG. 9 is a sectional view illustrating another example of the method of manufacturing the display unit illustrated in FIG. 1.

FIG. 10A is a sectional view of a display unit according to Modification Example 1.

FIG. 10B is a plan view of the display unit illustrated in FIG. 10A.

FIG. 11 illustrates examples of pixel shapes (A) to (D) according to Modification Example 2.

FIG. 12 is an example of a plan view illustrating a configuration of a display unit using the pixel shape (C) illustrated in FIG. 11.

FIG. 13A is a characteristic diagram illustrating changes in viewing angle and luminance in a comparative example.

FIG. 13B is a characteristic diagram illustrating changes in viewing angle and luminance in Example 1 of the present disclosure.

FIG. 14A is a characteristic diagram illustrating changes in viewing angle and luminance in a comparative example.

FIG. 14B is a characteristic diagram illustrating changes in viewing angle and luminance in Example 2 of the present disclosure.

FIG. 15A is a characteristic diagram illustrating changes in viewing angle and luminance in a comparative example.

FIG. 15B is a characteristic diagram illustrating changes in viewing angle and luminance in Example 3 of the present disclosure.

FIG. 16 is a characteristic diagram illustrating changes in viewing angle and luminance in Example 4 of the present disclosure.

FIG. 17A is a perspective view illustrating an appearance on a front side of Application Example 1 of the display units using the pixel according to the above-described embodiment and the like.

FIG. 17B is a perspective view illustrating an appearance on a back side of Application Example 1 of the display units using the pixel according to the above-described embodiment and the like.

FIG. 18 is a perspective view illustrating an appearance of Application Example 2.

FIG. 19A is a perspective view illustrating an appearance viewed from a front side of Application Example 2.

FIG. 19B is a perspective view illustrating an appearance viewed from a back side of Application Example 2.

FIG. 20 is a perspective view illustrating an appearance of Application Example 3.

FIG. 21 is a perspective view illustrating an appearance of Application Example 4.

FIG. 22A is a front view, a left side view, a right side view, a top view, and a bottom view in a state in which Application Example 5 is closed.

FIG. 22B is a front view and a side view in a state in which Application Example 5 is opened.

DETAILED DESCRIPTION

Some embodiments of the present disclosure will be described below in detail with reference to the accompanying drawings. It is to be noted that description will be given in the following order.

1. Embodiment
   1-1. Basic Configuration
   1-2. Entire Configuration of Display Unit
   1-3. Manufacturing Method
   1-4. Functions and Effects
2. Modification Examples
   Modification Example 1 (An example in which an aperture ratio is adjusted for each pixel)
   Modification Example 2 (Examples of a pixel shape)
   Modification Example 3 (An example in which reflectivity of an insulating film is adjusted)
3. Examples
4. Application Examples (Examples of Electronic Apparatus)

1. Embodiment

FIG. 1 illustrates an example of a planar configuration of a display unit (a display unit 1A) according to an embodiment of the present disclosure. This display unit 1 A is used for a finder of a camera, a head mounted display, or the like, and may have a configuration in which a plurality of pixels 2 are arranged in dots in a display region 110. Each of the pixels 2 may be configured of sub-pixels of three colors, i.e., a red pixel 2R, a green pixel 2G, and a blue pixel 2B, and the sub-pixels 2R, 2G, and 2B include light-emitting devices generating single-color light corresponding thereto (a red light-emitting device 10R generating single-color light of red (for the red pixel 2R), a green light-emitting device 10G generating single-color light of green (for the green pixel 2G), and a blue light-emitting device 10B generating single-color light of blue (for the blue pixel 2B), respectively) (all refer to FIG. 2).

1-2. Basic Configuration

FIG. 2 illustrates a sectional configuration of one pixel 2 illustrated in FIG. 1. The pixel 2 is configured of sub-pixels of three colors, i.e., the red pixel 2R, the green pixel 2G, and the blue pixel 2B as described above, each of which has a light emission region partitioned by an insulating film 13 (13RG, 13GB, and 13BR). Here, the light emission region of each of the sub-pixels 2R, 2G, and 2B may have, for example, a circular shape as illustrated in FIG. 1.

The insulating film 13 is a so-called partition wall that electrically separates the light-emitting devices 10R, 10G, and 10B from one another, and is provided with an opening section 13A as a light emission region in each of the sub-pixels 2R, 2G, and 2B. As will be described in detail later, an organic layer 14 that includes a light-emitting layer 14C (a red light-emitting layer 14CR, a green light-emitting layer 14CG, or a blue light-emitting layer 14CB) configuring corresponding one of the light-emitting devices 10R, 10G, and 10B is provided in the opening section 13A. Examples of a material of the insulating film 13 may include, but not be limited to, organic materials such as polyimide, a novolac resin, and an acrylic resin, and, for example, a combination of an organic material and an inorganic material may be used. Examples of the inorganic material may include $SiO_2$, SiO, SiC, and SiN. The insulating film 13 may be formed, for example, as a single-layer film made of the above-described organic material. In a case where the organic material and the inorganic material are combined, a laminated configuration of an organic film and an inorganic film may be adopted.

A sectional surface of the insulating film 13 may have, for example, a trapezoidal shape or a rectangular shape, and a side surface of the insulating film 13 serves as a reflective surface with respect to emission light LR, LG, and LB emitted from the light-emitting layers 14CR, 14CG, and 14CB. The emission light LR, LG, and LB is reflected by this reflective surface, and may be emitted upward, for example, as indicated by alternate long and short dash lines illustrated in FIG. 2.

In this embodiment, as illustrated in FIG. 2, the insulating film 13 has a reflective surface angle (θ) set for each of side surfaces by which the red pixel 2R, the green pixel 2G, and the blue pixel 2B are enclosed. Herein, the reflective surface angle (θ) may be, for example, an angle that a top surface of a first electrode 12 forms with the side surface of the insulating film 13, and may be, for example, from 45° to 90° both inclusive.

Emission light from each of the light-emitting layers 14CR, 14CG, and 14CB produces an interference effect different according to a light emission angle and a wavelength. Therefore, a light emission direction of light with high light emission intensity differs according to each of the light-emitting devices 10R, 10G, and 10B. FIG. 3A schematically illustrates a sectional configuration of a typically used display unit 100 and emission light LR, LG, and LB from light-emitting devices 110R, 110G, and 110B. It is to be noted that a solid line indicates light with high light emission intensity of the emission light LR, LG, and LB and a broken line indicates light with low light emission intensity of the emission light LR, LG, and LB.

In the display unit 100, insulating films 113 provided between the light-emitting devices 110R, 110G, and 110B are formed uniformly. In other word, the insulating films 113 provided between the light-emitting devices 110R, 110G, and 110B are so formed as to allow reflective surface angles (θ) thereof to be equal to one another. As described above, light emitted from each of light-emitting layers 114CR, 114CG, and 114CB of the light-emitting devices 110R, 110G, and 110B has light emission intensity different according to the wavelength. Therefore, as illustrated in FIG. 3A, emission light emitted from each of the light-emitting layers 114CR, 114CG, and 114CB (so-called light with high light emission intensity and light with low light emission intensity) is reflected by a reflective surface of the insulating film 113 to a direction different according to each wavelength. Accordingly, a color shift in a viewing angle between the light-emitting devices 110R, 110G, and 110B, and variation in luminance illustrated in FIG. 3B occur.

FIG. 4A schematically illustrates emission directions of emission light LR, LG, and LB in the display unit 1A of this embodiment. In this embodiment, as described above, an inclination angle of the insulating film 13 serving as a reflective surface with respective to the emission light LR, LG, and LB, i.e., a reflective surface angle (θ) is set for each of the sub-pixels 2R, 2G, and 2B. Therefore, as illustrated in FIG. 4A, light with high light emission intensity of the emission light LR, LG, and LB is emitted to the substantially the same direction. In other words, as illustrated in FIG. 4B, the light-emitting devices 10R, 10G, and 10B have substantially uniform viewing angle characteristics. Thus, a color shift between the sub-pixels 2R, 2G, and 2B and variation in luminance are eliminated.

It is to be noted that an optimum reflective surface angle (θ) of the insulating film 13 with respect to the emission light LR, LG, and LB varies according to not only a wavelength of emission light that is to be reflected but also film thicknesses of the first electrode 12 and the organic layer 14 including the light-emitting layer 14C that configure each light-emitting device 10 and materials of the respective layers. Therefore, when a sample is formed by calculating an approximate value (θ) of the reflective surface angle (θ) in each of the light-emitting devices 10R, 10G, and 10B with use of the following expression (1) where an angle at which light emission intensity is strong is φ, and then the reflective surface angle (θ) of each insulating film 13 is further adjusted, it is possible to further reduce the color shift by the viewing angle.

(Mathematical Expression)

$$\theta = 90 - \phi/2 (°) \quad (1)$$

As with this embodiment, the insulating film 13 having the reflective surface angle (θ) different for each of the sub-pixels 2R, 2G, and 2B may be formed by photolithography with use of, for example, a photosensitive resin, as will be described in detail later. More specifically, it is possible to form an arbitrary reflective surface with use of a photomask having light transmittance varying in a stepwise manner or a photoresist pattern for processing that is adjusted to a corresponding side wall angle in combination with typical dry etching.

It is to be noted that, in this embodiment, the reflective surface of the insulating film 13 is adjusted to an optimum angle for each of the red pixel 2R, the green pixel 2G, and the blue pixel 2B; however, the reflective surface angle (θ) of the insulating film 13 may be so designed as to allow the reflective surface angles for two of the sub-pixels to be equal to each other. More specifically, for example, as with a display unit 1B illustrated in FIG. 5, the reflective surface angles (θ) for a red pixel 3R and a blue pixel 3B may be equal to each other, and the reflective surface angle (θ) of the insulating film 13 may be designed for the red pixel 3R and the blue pixel 3B and for a green pixel 3G to adjust the emission direction of each emission light. Higher color reproductivity is obtained when the reflection angle is set for each of the pixels 3R, 3G, and 3B; however, even if the reflective surface angles (θ) for two of the three sub-pixels are adjusted to be equal to each other, color reproductivity is sufficiently improved. Moreover, it is possible to further simplify formation of the reflective surface angle of the insulating film 13.

Further, in FIG. 2, a state in which a top surface of the insulating film 13 is horizontal to a drive substrate 10 is illustrated; however, this embodiment is not limited thereto, and the top surface of the insulating film 13 may have asperities or a curved surface. Furthermore, the thickness of the insulating film 13 may be larger than that of the first electrode 12, and may be preferably a thickness at which light in a planar direction of emission light from the light-emitting layer 14C is allowed to be reflected to, for example, a top surface direction. More specifically, a distance from the top surface of the first electrode 12 to the top surface of the partition wall 13 may be 1 or more. It is to be noted that an upper limit of the distance may be preferably, but not particularly limited to, equal to or less than, for example, a pixel size.

1-2. Entire Configuration of Display Unit

FIG. 6 illustrates a configuration of the display unit 1A. As described above, this display unit 1 A is used as a small-to-medium-sized display unit such as a finder of a camera including organic EL devices as the light-emitting devices 10R, 10G, and 10B, and may include, for example, a signal line drive circuit 120 and a scanning line drive circuit 130 as drivers for image display around the display region 110.

A pixel drive circuit 140 is provided in the display region 110. FIG. 7 illustrates an example of the pixel drive circuit 140. The pixel drive circuit 140 is an active drive circuit formed below the first electrode 12 that will be described later. In other words, the pixel drive circuit 140 includes a driving transistor Tr1 and a writing transistor Tr2, a capacitor (a retention capacitor) Cs between the transistors Tr1 and Tr2, and the light-emitting device 10R (or 10G or 10B) connected in series to the transistor Tr1 between a first power supply line (Vcc) and a second power supply line (GND). Each of the driving transistor Tr1 and the writing transistor Tr2 is configured of a typical thin film transistor, and the thin film transistor may have, for example, but not exclusively, an inverted stagger configuration (a so-called bottom gate type) or a stagger configuration (a top gate type).

In the pixel drive circuit 140, a plurality of signal lines 120A are arranged along a column direction, and a plurality of scanning lines 130A are arranged along a row direction. An intersection of each signal line 120A and each scanning line 130A corresponds to one (one sub-pixel) of the light-emitting devices 10R, 10G, and 10B. Each of the signal lines 120A is connected to the signal line drive circuit 120, and an image signal is supplied from the signal line drive circuit 120 to a source electrode of the writing transistor Tr2 through the signal line 120A. Each of the scanning lines 130A is connected to the scanning line drive circuit 130, and a scanning signal is sequentially supplied from the scanning line drive circuit 130 to a gate electrode of the writing transistor Tr2 through the scanning line 130A.

As illustrated in FIG. 2, each of the light-emitting devices 10R, 10G, and 10B includes the first electrode 12 as an anode, the insulating film 13, the organic layer 14 including the light-emitting layer 14C, and a second electrode 15 as a cathode that are laminated in this order from the drive substrate 11 provided with the driving transistor Tr1 of the above-described pixel drive circuit 140 and a planarization insulating film (not illustrated). The driving transistor Tr1 is electrically connected to the first electrode 12 through a connection hole (not illustrated) provided in the planarization insulating film.

Such light-emitting devices 10R, 10G, and 10B are covered with a protective layer 16, and a sealing substrate 19 is bonded onto the entire protective layer 16 with an adhesive layer 17 in between. It is to be noted that the sealing substrate 19 includes a color filter 18A and a black matrix 18B, and in the color filter 18A, color filters (a red filter 18AR, a green filter 18AG, and a blue filter 18AB) of corresponding colors are provided on the light-emitting devices 10R, 10G, and 10B, respectively. The protective layer 16 may be made of silicon nitride ($SiN_x$), silicon oxide, a metal oxide, or the like. The adhesive layer 17 may be made of, for example, a thermosetting resin or an ultraviolet curable resin.

The first electrode 12 also functions as a reflective layer, and in order to improve light emission efficiency, the first electrode 12 may desirably have as high reflectivity as possible. In particular, in a case where the first electrode 12 is used as an anode, the first electrode 12 may be desirably made of a material with a high hole injection property. As such a first electrode 12, for example, a thickness in a laminate direction (hereinafter simply referred to as "thickness") thereof may be from 100 nm to 1000 nm both inclusive, and a simple substance of a metal element such as chromium (Cr), gold (Au), platinum (Pt), nickel (Ni), copper (Cu), tungsten (W), or silver (Ag), or an alloy thereof may be used. A transparent conductive film such as an oxide of indium and tin (ITO) may be provided on a surface of the first electrode 12. It is to be noted that, even a material in which presence of oxidized film on a surface and hole injection barrier caused by a small work function cause an issue in spite of high reflectivity is allowed to be used as the first electrode 12 by providing an appropriate hole injection layer.

The insulating film 13 is configured to secure insulation between the first electrode 12 and the second electrode 15, and to partition a light emission region into a desired shape, and may be made of, for example, a photosensitive resin. The insulating film 13 is provided around the first electrode 12, and a region exposed from the insulating film 13 of the first electrode 12, i.e., the opening section 13A of the insulating film 13 serves as a light emission region. In this embodiment, as described above, the side surface of the insulating film 13 has an inclination angle, i.e., the reflective surface angle (θ) set for each of the red pixel 2R, the green pixel 2G, and the blue pixel 2B. It is to be noted that the organic layer 14 and the second electrode 15 are provided on the insulating film 13 as well; however, only the light emission region emits light.

The organic layer 14 may have, for example, a configuration in which a hole injection layer 14A, a hole transport layer 14B, the light-emitting layer 14C, an electron transport layer 14D, and an electron injection layer 14E are laminated in order from the first electrode 12. The layers other than the light-emitting layer 14C may be provided as necessary. The organic layer 14 may have a configuration different for each of emission colors of the light-emitting devices 10R, 10G, and 10B. The hole injection layer 14A is a buffer layer to enhance hole injection efficiency and to prevent leakage. The hole transport layer 14B is configured to enhance hole transport efficiency to the light-emitting layer 14C. The light-emitting layer 14C is configured to emit light by the recombination of electrons and holes in response to the application of an electric field. The electron transport layer 14D is configured to enhance electron transport efficiency to the light-emitting layer 14C. The electron injection layer 14E is configured to enhance electron injection efficiency.

The hole injection layer 14A of the light-emitting device 10R may have a thickness of, for example, 5 nm to 300 nm both inclusive, and may be made of, for example, a hexaazatriphenylene derivative. The hole transport layer 14B of the light-emitting device 10R may have a thickness of, for example, 5 nm to 300 nm both inclusive, and may be made of bis[(N-naphthyl)-N-phenyl] benzidine (α-NPD). The light-emitting layer 14C of the light-emitting device 10R may have a thickness of, for example, 10 nm to 100 nm both inclusive, and may be made of an 8-quinolinol aluminum complex (Alq3) mixed with 40 vol % of 2,6-bis [4-[N-(4- methoxyphenyl) N-phenyl]amino styryl]naphthalene-1,5-dicarbonitrile (BSN-BCN). The electron transport layer 14D of the light-emitting device 10R may have a thickness of, for example, 5 nm to 300 nm both inclusive, and may be made of Alq3. The electron injection layer 14E of the light-emitting device 10R may have a thickness of, for example, about 0.3 nm, and may be made of LiF, $Li_2O$, or the like.

The second electrode 15 may have a thickness of, for example, about 10 nm, and may be made of an alloy of aluminum (Al), magnesium (Mg), calcium (Ca), or sodium (Na). In particular, an alloy of magnesium and silver (an Mg—Ag alloy) may be preferable, since the Mg—Ag alloy has both electrical conductivity and small absorption in a thin film. Although a ratio of magnesium to silver in the Mg—Ag alloy is not specifically limited, the ratio may be preferably within a range of Mg:Ag=20:1 to 1:1 both inclusive in film thickness ratio. Moreover, the material of the second electrode 15 may be an alloy of aluminum (Al) and lithium (Li) (an Al—Li alloy).

The second electrode 15 may also function as a semi-transparent reflective layer. In a case where the second electrode 15 has a function as a semi-transparent reflective layer, the light-emitting device 10R has a resonator structure MC1, and the resonator structure MC1 allows light emitted from the light-emitting layer 14C to be resonated between the first electrode 12 and the second electrode 15. In the resonator structure MC1, an interface between the first electrode 12 and the organic layer 14 serves as a reflective surface P 1, an interface between a middle layer 18 and the electron injection layer 14E serves as a semi-transmissive reflective surface P2, and the organic layer 14 serves as a resonating section, and the resonator structure MC1 allows light emitted from the light-emitting layer 14C to be resonated, and extracts the light from the semi-transmissive reflective surface P2. When the resonator structure MC1 is included, light emitted from the light-emitting layer 14C causes multiple interference to reduce a half-width of a spectrum of light extracted from the semi-transmissive reflective surface P2, thereby increasing peak intensity. In other words, light radiant intensity in a front direction is increased to improve color purity of emission light. Moreover, outside light incident from the sealing substrate 19 is allowed to be attenuated by multiple interference, and reflectivity of outside light in the light-emitting devices 10R, 10G, and 10B is allowed to be reduced to an extremely small value by a combination with the color filter 23.

1-3. Manufacturing Method

Next, a method of manufacturing the display unit 1A will be described with use of FIGS. 8A to 8C and FIG. 9.

First, the pixel drive circuit 140 including the first electrode 12 and the driving transistor Tr1 is formed on the drive substrate 11 made of the above-described material, and then a planarization insulating film is formed by coating an entire surface of the pixel drive circuit 140 with a photosensitive resin. The planarization insulating film is patterned into a predetermined shape along with formation of the connection hole through exposure and development, and then is fired.

Next, as illustrated in FIG. 8A, the first electrode 12 made of the above-described material is formed by, for example, a sputtering method, and the first electrode 12 is selectively removed by wet etching to be separated for each of the light-emitting devices 10R, 10G, and 10B, and then an entire surface of the drive substrate 11 is coated with a photosensitive resin that is to serve as the insulating film 13.

Next, opening sections are provided corresponding to light emission regions by, for example, a photolithography method, and then the photosensitive resin is fired to form the insulating film 13. More specifically, as illustrated in FIG. 8B, a photomask 2A with light transparency different for each of the pixels 2R, 2G, and 2B is formed on the photosensitive resin, and then exposed to light, thereby forming photoresist patterns 22 with specific inclination angles. It is to be noted that the photomask 2A is formed by coating, for example, a bottom surface of a glass substrate 21a with light-blocking resist film 21b and forming slits at predetermined positions. Next, dry etching is performed with use of the photoresist pattern 22 as a mask to form the insulating films 13 with reflective surface angles ($\theta$) different from one another as illustrated in FIG. 8C.

It is to be noted that the photomask 2A in which the predetermined slits are formed at positions corresponding to the pixels 2R, 2G, and 2B is used here; however, the photomask 2A is not limited thereto, and, for example, as illustrated in FIG. 9, the insulating film 13 may be processed with use of a photomask 21B in which inclination angles are so formed as to obtain predetermined light transparency.

Next, the hole injection layer 14A, the hole transport layer 14B, the light-emitting layer 14C, and the electron transport layer 14D that are made of the above-described materials with the above-described thicknesses of the organic layer 14 are formed by, for example, an evaporation method. Next, the second electrode 15 made of the above-described material with the above-described thickness is formed by, for example, an evaporation method. Therefore, the light-emitting devices 10R, 10G, and 10B as illustrated in FIGS. 2 and 5 are formed.

Next, the protective layer 16 made of the above-described material is formed on the light-emitting devices 10R, 10G, and 10B by, for example, a CVD method or a sputtering method. Next, the adhesive layer 17 is formed on the protective layer 16, and the sealing substrate 19 including the color filter 18A and the black matrix 18B is bonded onto the protective layer 16 with the adhesive layer 17 in between. Thus, the display units 1A or 1B illustrated in FIG. 2 or 5 is completed.

In this display unit A, the scanning signal is supplied from the scanning line drive circuit 130 to each pixel 2 through the gate electrode of the transistor Tr2, and the image signal is supplied from the signal line drive circuit 120 to the retention capacitor Cs through the writing transistor Tr2 to be retained in the retention capacitor Cs. In other words, on-off control of the transistor Tr1 is performed in response to the signal retained in the retention capacitor Cs, and a drive current Id is thereby injected into the light-emitting devices 10R, 10G, and 10B to allow the light-emitting devices 10R, 10G, and 10B to emit light by the recombination of holes and electrons. This light is multiply-reflected between the first electrode 12 and the second electrode 15, or reflected light from the first electrode 12 and light emitted from the light-emitting layer 14C reinforce each other by interference, and the light passes through the second electrode 15, the color filter 23, and the sealing substrate 19 to be extracted.

1-4. Functions and Effects

In this embodiment, the side surface of the insulating film 13 that separates the respective sub-pixels 2R, 2G, and 2B from one another serves as a reflective surface with respect to light emitted from the light-emitting layer 14C, and the angle (the reflective surface angle ($\theta$)) of the reflective surface is set for each of the sub-pixels 2R, 2G, and 2B. The insulating film 13 having the reflective surface angle (θ) different for each of the sub-pixels 2R, 2G, and 2B is allowed to be formed by performing photolithography using a photomask with predetermined light transparency at a position corresponding to each of the pixels 2R, 2G, and 2B. Therefore, in particular, emission light with high light emission intensity of which the emission direction differs according to each wavelength of emission light of each of the light-emitting devices 10R, 10G, and 10B is allowed to be reflected in an arbitrary direction. More specifically, emission light with high light emission intensity from the sub-pixels 2R, 2G, and 2B is reflected to substantially the same direction.

Thus, in the display unit 1A and the method of manufacturing the same in this embodiment, an inclined surface (the side surface) of the insulating film 13 that partitions the sub-pixels 2R, 2G, and 2B and serves as the reflective surface with respect to emission light from the light-emitting layer 14C is formed by photolithography using a photomask with predetermined light transparency. Therefore, the inclined surface having a reflection angle different for each of the pixels 2R, 2G, and 2B is allowed to be easily formed. In other words, the inclined surfaces of the insulating films 13 of the respective sub-pixels 2R, 2G, and 2B are allowed to be formed separately at angles suitable for the emission light LR, LG, and LB of the light emitting devices 10R, 10G, and 10B, respectively, more specifically at angles (the reflective surface angles (θ)) at which emission light with high light emission intensity different for each wavelength in the sub-pixels 2R, 2G, and 2B is allowed to be reflected to substantially the same reflection direction. Accordingly, the occurrence of the color shift in the sub-pixels 2R, 2G, and 2B is suppressed, and color reproductivity is improved.

Moreover, emission light with high light emission intensity is allowed to be used efficiently; therefore, variation in luminance of each of the sub-pixels 2R, 2G, and 2B is suppressed, and luminance is improved. Further, since light emission efficiency is improved, a display unit with low power consumption is allowed to be provided.

4. Modification Examples

Modification examples of the above-described embodiment will be described below. In the following description, like components are denoted by like numerals as of the above-described embodiment and will not be further described.

Modification Example 1

FIG. 10A schematically illustrates a sectional configuration of a pixel 4 (sub-pixels 4R, 4G, and 4B) configuring a display unit IC according to Modification Example 1, and FIG. 10B schematically illustrates light emission regions of the respective sub-pixels 4R, 4G, and 4B, i.e., sizes of openings of opening sections 13AR, 13AG, and 13AB. This display unit 1C has a configuration similar to those of the above-described display units 1A and 1B, except that the aperture ratios of the light emission regions of the light-emitting devices 10R, 10G, and 10B, i.e., the opening sections 13AR, 13AG, and 13AB of the pixels 4R, 4G, and 4B are different from one another.

In outputs of the respective pixels 4R, 4G, and 4B, the output of the blue pixel 4B is typically high, and the output of the red pixel 4R is typically low. This is caused by properties of materials forming the light-emitting layers 14CR, 14CG, and 14CB of the light-emitting devices 10R, 10G, and 10B. In a display unit having an output different for each of the pixels 4R, 4G, and 4B, variation in color reproductivity, i.e., so-called coloring may be caused by the viewing angle.

On the other hand, in this modification example, the aperture ratios of the opening sections 13AR, 13AG, and 13AB of the insulating film 13 are adjusted for each pixel. More specifically, for example, based on the opening section 13AG of the green pixel 4G, the opening section 13AR of the insulating film 13 in the red pixel 4R is increased in size, and the opening section 13AB of the insulating film 13 in the blue pixel 4B is decreased in size. In other words, as illustrated in FIG. 10B, the aperture ratios of the red pixel 4R, the green pixel 4G, and the blue pixel 4B are made smaller (the light emission regions are made narrower) in this order. The light emission levels of RGB are made uniform by making luminances in the pixels 4R, 4G, and 4B uniform in such a manner, thereby suppressing coloring by the viewing angle.

Modification Example 2

FIG. 11 schematically illustrates other examples of pixel shapes of the pixels 2 to 4 configuring the above-describe display units 1A to 1C. In the above-described embodiment and the above-described Modification Example 1, a case where the shape of the pixel 2, i.e., the light emission region is circular is described; however, the shape is not limited thereto. For example, the shape may be oval as illustrated in FIG. 11(A), rectangular as illustrated in FIGS. 11(B) and (C), or substantially rectangular as illustrated in FIG. 11(D). In the circular shape as with the above-described embodiment, respective pixels arc arranged in dots; however, in a case where the pixel 2 has a vertically long rectangular shape as illustrated in FIG. 11(C), for example, as illustrated in FIG. 12, the pixels may be arranged in a matrix.

Modification Example 3

It is to be noted that in the insulating film 13 configuring the above-described display units 1A to 1C, in addition to designing the reflective surface angle (θ) for each of the sub-pixels 2R, 2G, and 2B, the constituent material of the insulating film may be changed. For example, an insulating film may be formed with use of materials with different refractive indices, thereby adjusting the emission direction of the emission light from each of the light-emitting layers 14CR, 14CG, and 14CB.

The materials with different refractive indices may include the following materials. Examples of a material with a high refractive index may include silicon nitride ($Si_3N_4$), aluminum oxide ($Al_2O_3$), chromium oxide ($Cr_2O_3$), gallium oxide ($Ga_2O_3$), hafnium oxide ($HfO_2$), nickel oxide (NiO), magnesium oxide (MgO), indium tin oxide (ITO), lanthanum oxide ($La_2O_3$), niobium oxide ($Nb_2O_5$), tantalum oxide ($Ta_2O_5$), yttrium oxide ($Y_2O_3$), tungsten oxide ($WO_3$), titanium monoxide (TiO), titanium dioxide ($TiO_2$), and zirconium oxide ($ZrO_2$). Examples of a material with a low refractive index may include silicon oxide ($SiO_2$), aluminum fluoride ($AlF_3$), calcium fluoride ($CaF_2$), cerium fluoride ($CeF_3$), lanthanum fluoride ($LaF_3$), lithium fluoride (LiF), magnesium fluoride ($MgF_2$), neodymium fluoride ($NdF_3$), and sodium fluoride (NaF).

Examples of a specific combination may include a combination of silicon nitride ($Si_3N_4$) and silicon oxide ($SiO_2$).

3. Examples

Examples according to the display unit of the present disclosure will be described below.

Example 1

In this example, as a standard sample, the display unit 1A with a pixel configuration described in the above-described embodiment was fabricated. More specifically, in the light-emitting devices 10R, 10G, and 10B, film thicknesses of respective layers including the light-emitting layer 14C were equal in the sub-pixels 2R, 2G, and 2B. Under this condition, a sample 1 (a comparative example) and a sample 2 (the example) were fabricated. In the sample 1, the reflective surface angle (θ) of the insulating film 13 was equal in the pixels 2R, 2G, and 2B, and in the sample 2 (the example), the reflective surface angle (θ) of the insulating film 13 was adjusted for each of the sub-pixels 2R, 2G, and 2B, and more specifically, the reflective surface angle (θ) of the insulating film 13 in the green pixel 2G was 70°, and the reflective surface angle (θ) in the red pixel 2R and the blue pixel 2B was 80°. Luminance at each viewing angle of each of the sample 1 and the sample 2 was measured.

FIGS. 13A and 13B are characteristic diagrams illustrating a relationship between the viewing angle and luminance (intensity) in the samples 1 and 2, respectively. It was found that in FIG. 13A, variation between green emission light, and red emission light and blue emission light was large, and in FIG. 13B, the values of luminance at each viewing angle in the pixels 2R, 2G, and 2B were substantially equal. Moreover, compared to FIG. 13A, it was found that the luminance at a viewing angle of 0° was greatly improved.

Example 2

This example differs from the above-described example in that the thickness of the first electrode 12 was changed for each light-emitting device. FIG. 14A is a characteristic diagram illustrating a relationship between a viewing angle and luminance of a sample 3 as a comparative example, and FIG. 14B is a characteristic diagram illustrating a relationship between a viewing angle and luminance of a sample 4 as the example. It is to be noted that the reflective surface angles (θ) of the insulating films 13 in the pixels 2R, 2G, and 2B of the sample 4 were 80°, 70°, and 70°, respectively.

As can be seen from FIG. 14A, improved luminance was obtained by adjusting the film thickness of the first electrode 12 for each of the pixels 2R, 2G, and 2B; however, variation in luminance at viewing angles between the pixels 2R, 2G, and 2B was noticeable. On the other hand, as can be seen from FIG. 14B, as with the sample 2 of the above-described example 1, the values of luminance at each viewing angle in the sub-pixels 2R, 2G, and 2B were substantially equal.

Example 3

This example differs from the above-described example in that the film thickness of the light-emitting layer 14C was changed. FIG. 15A is a characteristic diagram illustrating a relationship between a viewing angle and luminance of a sample 5 as a comparative example, and FIG. 15B is a characteristic diagram illustrating a relationship between a viewing angle and luminance of a sample 6 as an example. It is to be noted that the reflective surface angles (θ) of the insulating films 13 in the pixels 2R, 2G, and 2B of the sample 6 were 70°, 70°, and 80°, respectively.

As can be seen from FIG. 15A, compared to the sample 1, improved luminance was obtained by adjusting the film thickness of the organic layer 14 for each of the pixels 2R, 2G, and 2B; however, variation in luminance at viewing angles between the pixels 2R, 2G, and 2B was noticeable. On the other hand, as can be seen from FIG. 14B, as with the samples 2 and 4 of the above-described example 1, the values of luminance at each viewing angle in the sub-pixels 2R, 2G, and 2B were substantially equal.

As can be seen from Examples 2 and 3, even if the thicknesses of the first electrodes 12 or the like of the light-emitting devices 10R, 10G, and 10B are changed for respective sub-pixels, the color shift by the viewing angle is allowed to be reduced.

Example 4

In this example (a sample 7), the size of the light emission of the sample 6 was adjusted for each pixel. More specifically, in the sample 6, the size of the light emission region of the red pixel 2R was increased by 3%, and the size of the light emission region of the blue pixel 2B was decreased by 3%. FIG. 16 is a characteristic diagram illustrating a relationship between a viewing angle and luminance of the sample 7.

As can be seen from FIG. 16, the color shift by the viewing angles in each of the pixels 2R, 2G, and 2B is reduced by adjusting not only the reflective surface angle (θ) of the insulating film 13 but also the light emission region for each of the pixels 2R, 2G, and 2B, thereby achieving optimization.

4. Application Examples

The display units 1A to 1C including the pixels 2 to 4 described in the above-described embodiment and the above-described Modification Examples 1 to 3 may be preferably used specifically for a finder of a camera and a display unit of a head mounted display, and may be mounted in electronic apparatuses in any fields that display an image (or a picture), for example, the following electronic apparatuses.

FIGS. 17A and 17B illustrate an appearance of a smartphone. This smartphone may include, for example, a display section 110 (the display unit A), a non-display section (an enclosure) 120, and an operation section 130. The operation section 130 may be disposed on a front surface or a top surface of the non-display section 120.

FIG. 18 illustrates an appearance configuration of a television. This television may include, for example, an image display screen section 200 (the display unit A) including a front panel 210 and a filter glass 220.

FIGS. 19A and 19B illustrate appearance configurations of a front surface and a back surface of a digital still camera, respectively. This digital still camera may include, for example, a light-emitting section 310 for a flash, a display section 320 (the display unit A), a menu switch 330, and a shutter button 340.

FIG. 20 illustrates an appearance configuration of a notebook personal computer. This personal computer may include, for example, a main body 410, a keyboard 420 for operation of inputting characters and the like, and a display section 430 (the display unit A) that displays an image.

FIG. 21 illustrates an appearance configuration of a video camera. This video camera may include, for example, a main body section 510, a lens 520 provided on a front side surface of the main body section 510 and for shooting an image of a subject, a shooting start and stop switch 530, and a display section 540 (the display unit A).

FIGS. 22A and 22B illustrate an appearance configuration of a mobile phone. FIG. 19A illustrates a front surface, a left side surface, a right side surface, a top surface, and a bottom surface in a state in which the mobile phone is closed. FIG. 19B illustrates a front surface and a side surface in a state in which the mobile phone is opened. This mobile phone may have a configuration in which, for example, a top side enclosure 610 and a bottom-side enclosure 620 are connected together through a connection section (hinge section) 620, and the mobile phone may include a display 640 (the display units 1A to 1C), a sub-display 650, a picture light 660, and a camera 670.

Although the present disclosure is described referring to the embodiment and Modification Examples 1 to 3, the present disclosure is not limited thereto, and may be variously modified. For example, the material and thickness of each layer, the method and conditions of forming each layer are not limited to those described in the above-described embodiment and the like, and each layer may be made of any other material with any other thickness by any other method under any other conditions.

Moreover, all of the respective layers described in the above-described embodiment and the like may not be necessarily included, and one or more of them may be omitted as necessary. Further, a layer other than the layers described in the above-described embodiment and the like may be added. For example, one or more layers using a material having hole transport capability such as a common hole transport layer described in Japanese Unexamined Patent Application Publication No. 2011-233855 may be added between a charge transport layer 17 and the blue light-emitting layer 14CB of the blue light-emitting device 10B. When such a layer is added, light emission efficiency and lifetime characteristics of the blue light-emitting device 10B are improved.

Furthermore, in the above-described embodiment and the like, a case where the sub-pixels configuring one pixel include three pixels, i.e., the red pixel, the green pixel, and the blue pixel is described as an example; however, a white pixel or a yellow pixel may be added in addition to the three sub-pixels.

It is to be noted that the present technology is allowed to have following configurations.

(1) A display unit including:
a plurality of pixels configured to emit emission light different from one another; and
an insulating film provided between the plurality of pixels and having a reflective surface with respect to the emission light, in which an angle of the reflective surface of the insulating film is set for each of the pixels.

(2) The display unit according to (1), in which a red pixel, a green pixel, and a blue pixel are included, and the reflective surface angles (θ) for the red pixel, the green pixel, and the blue pixel are different from each other.

(3) The display unit according to (1) or (2), in which a first pixel including a red pixel, a green pixel, or a blue pixel and a second pixel of a color different from the first pixel, and the reflective surface angle (θ) of the first pixel is different from that of the second pixel.

(4) The display unit according to any one of (1) to (3), in which the reflective surface angle (θ) is determined with use of an angle ($) at which light emission intensity of the emission light is strong.

(5) The display unit according to any one of (1) to (4), in which the plurality of pixels have different aperture ratios from one another.

(6) The display unit according to any one of (1) to (5), in which a reflective surface of the insulating film has a refractive index different for each of the plurality of pixels.

(7) A method of manufacturing a display unit including:
arranging a plurality of pixels configured to emit emission light different from one another; and
forming, between the plurality of pixels, an insulating film having a reflective surface with respect to the emission light and in which an angle of the reflective surface is set for each of the pixels.

(8) The method of manufacturing the display unit according to (7), in which the angle of the reflective surface of the insulating film is adjusted with use of photolithography using of a photomask having light transmittance varying in a stepwise manner.

(9) An electronic apparatus provided with a display unit, the display unit including:
a plurality of pixels configured to emit emission light different from one another; and
an insulating film provided between the plurality of pixels and having a reflective surface with respect to the emission light,
in which an angle of the reflective surface of the insulating film is set for each of the pixels.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display unit, comprising:
a substrate, and
a plurality of light emitting devices provided on the substrate,
the plurality of light emitting devices include at least a first light emitting device, a second light emitting device and the third light emitting device,
the first light emitting device includes a first electrode, a first part of an organic layer and a first part of a second electrode, the second light emitting device includes a third electrode, a second part of an organic layer and a second part of the second electrode, and the third light emitting device includes a fourth electrode, a third part of an organic layer and a third part of the second electrode,
the first light emitting device includes a first light emission region, the second light emitting device includes a second light emission region, and the third light emitting device includes a third light emission region,
an insulating film is disposed between the first electrode and the third electrode and between the third electrode and the fourth electrode, and the insulating film is on the substrate,
the insulating film includes a first opening corresponding to the first light emission region, a second opening corresponding to the second light emitting region and a third opening corresponding to the third light emitting region,
a first angle is formed between a top surface of the first electrode and a first side surface of the insulating film in a cross sectional view at a first point where the top surface of the first electrode contacts the insulating film, a second angle is formed between a top surface of the third electrode and a second side surface of the insulating film in the cross sectional view at a second point where the top surface of the third electrode contacts the insulating film, and a first distance from the first point to a first edge point of a top surface of the insulating film is different from a second distance from the second point to a second edge point of a top surface of the insulating film.

2. The display unit according to claim 1, wherein a first ratio of the first opening, a second ratio of the second opening and a third ratio of the third opening are different.

3. The display unit according to claim 1, wherein a third angle is formed between a top surface of the fourth electrode and a third side surface of the insulating film in a cross sectional view.

4. The display unit according to claim 1, further comprising a color filter associated with the light emitting devices.

5. The display unit according to claim 1, further comprising a light blocking layer configured to block light from the light emitting devices.

6. The display unit according to claim 5, wherein the light blocking layer includes a black matrix associated with the light emitting devices.

7. The display unit according to claim 6, wherein the black matrix is provided at a light emission direction.

8. The display unit according to claim 1, wherein the first opening is larger than the second opening.

9. The display unit according to claim 8, wherein the first light emitting device is configured to emit light corresponding to a first color, the second light emitting device is configured to emit light corresponding to a second color, and the third light emitting device is configured to emit light corresponding to a third color.

10. The display unit according to claim 9, wherein the first color, the second color, and the third color are different.

11. The display unit according to claim 8, wherein a top surface of the insulating film has asperities or a curved surface.

12. The display unit according to claim 8, wherein the first opening is larger than the third opening.

13. The display unit according to claim 12, wherein the second opening is larger than the third opening.

14. The display unit according to claim 13, wherein the first light emitting device is configured to emit red light, the second light emitting device is configured to emit green light, and the third light emitting device is configured to emit blue light.

15. The display unit according to claim 1, wherein the substrate includes a pixel control circuit, and wherein the pixel control circuit includes a driving transistor, a writing transistor and a capacitor.

16. The display unit according to claim 1, further comprising a sealing layer configured to seal the light emitting devices.

17. The display unit according to claim 1, wherein the substrate includes a drive circuit configured to control the light emitting devices.

18. The display unit according to claim 1, wherein the insulating film has a reflective surface with respect to emission light of the first, second, and third light emitting elements.

19. The display unit according to claim 18, wherein the reflective surface angle ($\theta$) is determined with use of an angle ($\phi$) at which light emission intensity of the emission light is above a first level.

20. An electronic apparatus comprising a display unit, wherein the display unit comprises:

a substrate, and a plurality of light emitting devices provided on the substrate, the plurality of light emitting devices include at least a first light emitting device, a second light emitting device and the third light emitting device, the first light emitting device includes a first electrode, a first part of an organic layer and a first part of a second electrode, the second light emitting device includes a third electrode, a second part of an organic layer and a second part of the second electrode, and the third light emitting device includes a fourth electrode, a third part of an organic layer and a third part of the second electrode, the first light emitting device includes a first light emission region, the second light emitting device includes a second light emission region, and the third light emitting device includes a third light emission region, an insulating film is disposed between the first electrode and the third electrode and between the third electrode and the fourth electrode, and the insulating film is on the substrate, the insulating film includes a first opening corresponding to the first light emission region, a second opening corresponding to the second light emitting region and a third opening corresponding to the third light emitting region, a first angle is formed between a top surface of the first electrode and a first side surface of the insulating film in a cross sectional view at a first point where the top surface of the first electrode contacts the insulating film, a second angle is formed between a top surface of the third electrode and a second side surface of the insulating film in the cross sectional view at a second point where the top surface of the third electrode contacts the insulating film, and a first distance from the first point to a first edge point of a top surface of the insulating film is different from a second distance from the second point to a second edge point of a top surface of the insulating film.

* * * * *